(12) United States Patent
Fukuda

(10) Patent No.: US 10,909,915 B2
(45) Date of Patent: *Feb. 2, 2021

(54) LIGHT EMITTING DEVICE

(71) Applicant: JOLED INC., Tokyo (JP)

(72) Inventor: Toshihiro Fukuda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/413,221

(22) Filed: May 15, 2019

(65) Prior Publication Data

US 2019/0371233 A1 Dec. 5, 2019

(30) Foreign Application Priority Data

May 29, 2018 (JP) ................................ 2018-102520
Apr. 12, 2019 (JP) ................................ 2019-076571

(51) Int. Cl.
*G09G 3/3225* (2016.01)
*H01L 27/32* (2006.01)
*G09G 3/20* (2006.01)
*H01L 51/52* (2006.01)

(52) U.S. Cl.
CPC ......... *G09G 3/3225* (2013.01); *G09G 3/2003* (2013.01); *H01L 27/3209* (2013.01); *H01L 51/5203* (2013.01)

(58) Field of Classification Search
None
See application file for complete search history.

(56) References Cited

U.S. PATENT DOCUMENTS

| 7,102,282 | B1 | 9/2006 | Yamada et al. |
| 2011/0187260 | A1 | 8/2011 | Fukuda et al. |
| 2011/0187261 | A1 | 8/2011 | Fukuda et al. |
| 2018/0151840 | A1* | 5/2018 | Fukuda ............... H01L 51/5265 |
| 2019/0123305 | A1* | 4/2019 | Fukuda ............... H01L 27/3206 |
| 2019/0348639 | A1* | 11/2019 | Fukuda ............... H01L 51/5265 |

FOREIGN PATENT DOCUMENTS

| JP | 2006-244713 A | 9/2006 |
| JP | 2011-159431 A | 8/2011 |
| JP | 2011-159433 A | 8/2011 |
| WO | 01/39554 A1 | 5/2001 |

* cited by examiner

*Primary Examiner* — David D Davis
(74) *Attorney, Agent, or Firm* — Chip Law Group

(57) ABSTRACT

Disclosed is a light emitting device which includes organic electroluminescent sections each including a first electrode layer, an organic light emitting layer, a second electrode layer and a reflective layer in this order, and a light extraction surface. The reflective layer includes two reflective interfaces. In each of the organic electroluminescent sections, a microcavity structure is formed by a structure including a first reflective interface, a second reflective interface, and the two reflective interfaces. The organic electroluminescent sections include first organic electroluminescent sections and second organic electroluminescent sections. The microcavity structure is configured in such a manner that the first reflective interface and the second reflective interface intensify the light in the first wavelength band and the light in the second wavelength band, and that the two reflective interfaces weaken the light in the first wavelength band and intensify the light in the second wavelength band.

10 Claims, 15 Drawing Sheets

LIGHT EMITTING DEVICE

CROSS REFERENCE TO RELATED APPLICATIONS

This application claims the benefit of Japanese Priority Patent Application No. 2018-102520 filed on May 29, 2018 and also claims the benefit of Japanese Priority Patent Application No. 2019-076571 filed on Apr. 12, 2019, the entire contents of which are incorporated herein by reference.

BACKGROUND

The present disclosure relates to a light emitting device using organic electroluminescent sections that emit light by an organic electroluminescence (EL) phenomenon.

In recent years, a large number of proposals have been made in regard of the structure of a light emitting device using organic EL elements (see, for example, WO 01/039554, JP 2006-244713A, JP 2011-159431A, and JP 2011-159433A).

SUMMARY

Among such light emitting devices, those of the top emission system have a problem that attendant on enlargement in size, it has become difficult to realize both good feed performance and good viewing angle characteristic of chromaticity. Therefore, it is desirable to provide a light emitting device in which both good feed performance and good viewing angle characteristic of chromaticity can be realized.

According to an embodiment of the present disclosure, there is provided a light emitting device which includes a plurality of organic electroluminescent sections each including a first electrode layer, an organic light emitting layer, a second electrode layer having a film thickness of not less than 15 nm and a reflective layer in this order, and a light extraction surface from which light emitted from each of the organic electroluminescent sections through the reflective layer is extracted. The reflective layer includes two reflective interfaces. In each of the organic electroluminescent sections, a microcavity structure is formed by a structure including a first reflective interface on the organic light emitting layer side of the first electrode layer, a second reflective interface on the organic light emitting layer side of the second electrode layer, and the two reflective interfaces included in the reflective layer. The plurality of organic electroluminescent sections include a plurality of first organic electroluminescent sections that emit light in a first wavelength band, and a plurality of second organic electroluminescent sections that emit light in a second wavelength band on a shorter wavelength side than the first wavelength band. In each of the first organic electroluminescent sections and each of the second organic electroluminescent sections, the microcavity structure is configured in such a manner that the first reflective interface and the second reflective interface intensify the light in the first wavelength band and the light in the second wavelength band, and that the two reflective interfaces included in the reflective layer weaken the light in the first wavelength band and intensify the light in the second wavelength band.

According to the light emitting device of the embodiment of the present disclosure, worsening of viewing angle characteristic of chromaticity can be restrained even in the case where the second electrode layer is enlarged in film thickness. Therefore, both good feed performance and good viewing angle characteristic of chromaticity can be secured. Note that the advantageous effects described here are not limitative, and the effects of the present disclosure may be any of the effects described herein.

DETAILED DESCRIPTION OF THE PREFERRED EMBODIMENT

Figure 1:
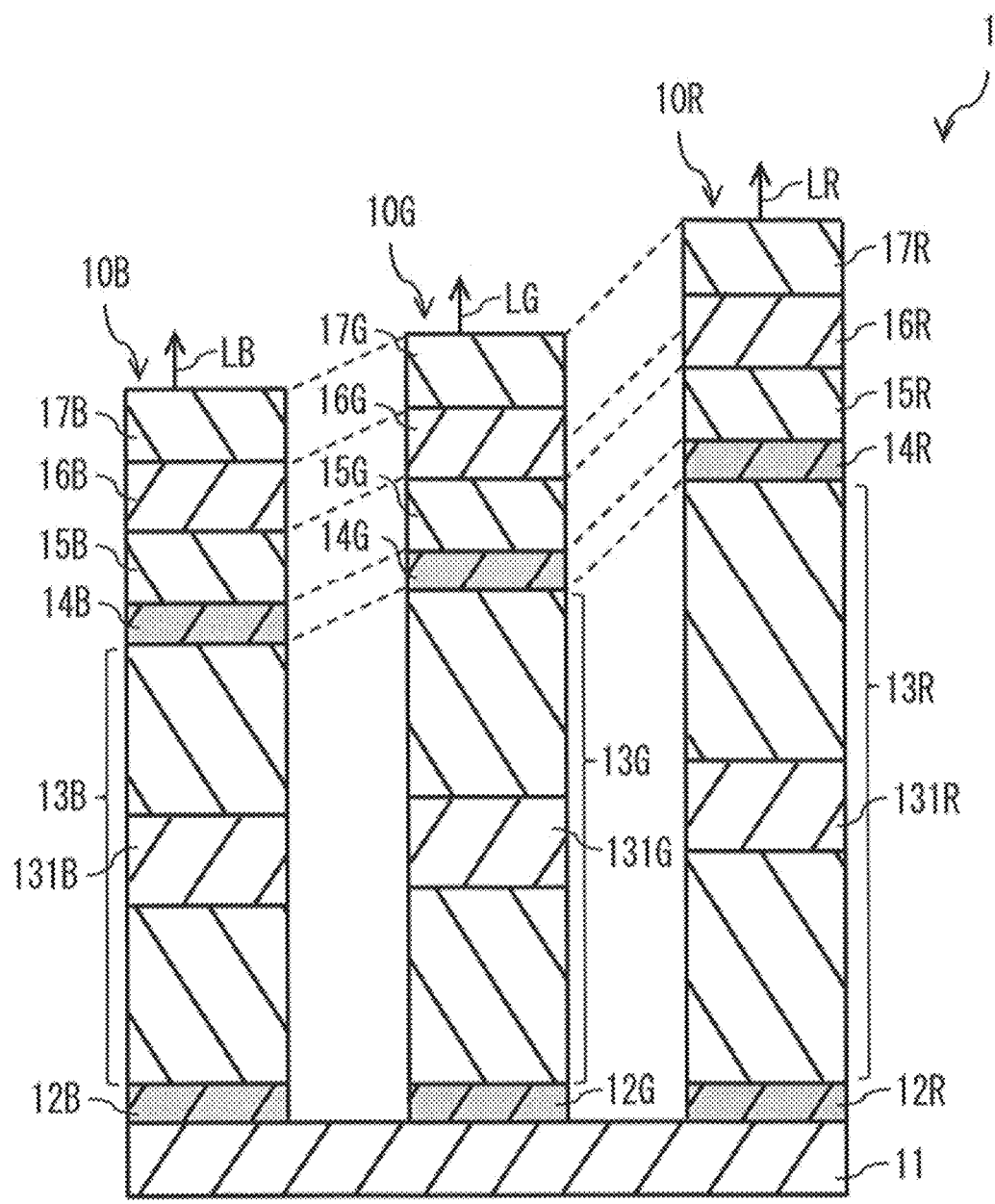
FIG. 1 is a sectional view depicting a general configuration of a light emitting device according to an embodiment of the present disclosure.

An embodiment of the present disclosure will be described in detail below, referring to the drawings, in the following order.
1. Embodiment (Light emitting device)
2. Modification (Light emitting device)
3. Application examples (Display device, Electronic apparatus, Illumination apparatus)

1. Embodiment

Configuration

FIG. 1 depicts a sectional configuration of a major part of a light emitting device 1 according to an embodiment of the present disclosure. The light emitting device 1 includes a substrate 11, over which a plurality of red light emitting sections 10R, a plurality of green light emitting sections 10G and a plurality of blue light emitting sections 10B are provided. The red light emitting section 10R corresponds to a specific example of the "organic electroluminescent section" and the "first organic electroluminescent section" in the present disclosure. The green light emitting section 10G corresponds to a specific example of the "organic electroluminescent section" and the "first organic electroluminescent section" in the present disclosure. The blue light emitting section 10B corresponds to a specific example of the "organic electroluminescent section" and the "second organic electroluminescent section" in the present disclosure.

The red light emitting section 10R includes an electrode layer 12R, a red organic layer 13R including a red light emitting layer 131R, an electrode layer 14R, a transparent layer 15R, a transparent layer 16R and a transparent layer 17R in this order over the substrate 11. The green light emitting section 10G includes an electrode layer 12G, a green organic layer 13G including a green light emitting layer 131G, an electrode layer 14G, a transparent layer 15G, a transparent layer 16G and a transparent layer 17G in this order over the substrate 11. The blue light emitting section 10B includes an electrode layer 12B, a blue organic layer 13B including a blue light emitting layer 131B, an electrode layer 14B, a transparent layer 15B, a transparent layer 16B and a transparent layer 17B in this order over the substrate 11. The electrode layers 12R, 12G and 12B correspond to specific examples of the "first electrode layer" in the present disclosure. The electrode layers 14R, 14G and 14B correspond to specific examples of the "second electrode layer" in the present disclosure. A laminate including the transparent layer 15R, the transparent layer 16R and the transparent layer 17R corresponds to a specific example of the "reflective layer" in the present disclosure. A laminate including the transparent layer 15G, the transparent layer 16G and the transparent layer 17G corresponds to a specific example of the "reflective layer" in the present disclosure. A laminate including the transparent layer 15B, the transparent layer 16B and the transparent layer 17B corresponds to a specific example of the "reflective layer" in the present disclosure.

The red light emitting section 10R emits light in a red wavelength region (red light LR) generated in the red light emitting layer 131R by current injection by the electrode layer 12R and the electrode layer 14R, from the transparent layer 17R side. The green light emitting section 10G emits light in a green wavelength region (green light LG) generated in the green light emitting layer 131G by current injection by the electrode layer 12G and the electrode layer 14G, from the transparent layer 17G side. The blue light emitting section 10B emits light in a blue wavelength region (blue light LB) generated in the blue light emitting layer 131B by current injection by the electrode layer 12B and the electrode layer 14B, from the transparent layer 17B side. The light emitting device 1 is configured such that the lights generated from the red light emitting layer 131R, the green light emitting layer 131G and the blue light emitting layer 131B are subjected to multiple reflection between the electrode layers 12R, 12G and 12B and the transparent layers 17R, 17G and 17B and the lights are extracted from the transparent layer 17G, 17G and 17B side. In other words, the light emitting device 1 is a top emission type light emitting device having a resonator structure.

The substrate 11 is a plate-shaped member for supporting the red light emitting layers 131R, the green light emitting layers 131G and the blue light emitting layers 131B, and includes, for example, a transparent glass substrate or semiconductor substrate or the like. The substrate 11 may include a flexible substrate. The substrate may be a circuit substrate provided with a circuit or circuits (a pixel circuit or circuits 18-1 described later) for driving the red light emitting layers 131R, the green light emitting layers 131G and the blue light emitting layers 131B.

The electrode layers 12R, 12G and 12B are anode electrodes, and function also as reflecting mirrors. The electrode layers 12R, 12G and 12B are formed using a light-reflective material, for example. Examples of the light-reflective material used for the electrode layers 12R, 12G and 12B include aluminum (Al), aluminum alloys, platinum (Pt), gold (Au), chromium (Cr), and tungsten (W). The electrode layers 12R, 12G and 12B may be configured, for example, by stacking a transparent conductive material and a light-reflective material. The thicknesses of the electrode layers 12R, 12G and 12B are, for example, 100 to 300 nm.

The red organic layer 13R includes, for example, a hole injection layer, a hole transport layer, the red light emitting layer 131R, an electron transport layer and an electron injection layer in this order from a position near the electrode layer 12R. The green organic layer 13G includes, for example, a hole injection layer, a hole transport layer, the green light emitting layer 131G, an electron transport layer and an electron injection layer in this order from a position near the electrode layer 12G. The blue organic layer 13B includes, for example, a hole injection layer, a hole transport layer, the blue light emitting layer 131B, an electron transport layer and an electron injection layer in this order from a position near the electrode layer 12B.

The hole injection layer is a layer for preventing leakage. The hole injection layer is formed, for example, by using hexaazatriphenylene (HAT) or the like. The thickness of the hole injection layer is, for example, 1 to 20 nm. The hole transport layer is formed, for example, by using α-NPD [N,N'-di(1-naphthyl)-N,N'-diphenyl-[1,1'-biphenyl]-4,4'-diamine]. The thickness of the hole transport layer is, for example, 15 to 100 nm.

The red light emitting layer 131R, the green light emitting layer 131G and the blue light emitting layer 131B are each configured to emit light in a predetermined color by coupling of holes and electrons. The thicknesses of the red light emitting layer 131R, the green light emitting layer 131G and the blue light emitting layer 131B are, for example, 5 to 50 nm. The red light emitting layer 131R emits light in the red wavelength region (first wavelength band). The red light emitting layer 131R is formed, for example, by using rubrene doped with a pyrromethene boron complex. In this instance, rubrene is used as a host material. The green light emitting layer 131G emits light in the green wavelength region (first wavelength band). The green light emitting layer 131G is formed, for example, by using Alq3 (trisquinolinol aluminum complex). The blue light emitting layer 131B emits light in the blue wavelength region on the shorter wavelength side than the red wavelength region (in a second wavelength band on the shorter wavelength side than the first wavelength band). The blue light emitting layer 131B is formed, for example, by using ADN (9,10-di(2-naphthyl)anthracene) doped with a diaminochrysene derivative. In this instance ADN is used as a host material, and is a vapor deposited film having a thickness of 20 nm, for example. The diaminochrysene derivative is used as a dopant material, and the doping is, for example, 5% doping in terms of relative film thickness ratio.

The electron transport layer is formed by using BCP (2,9-dimethyl-4,7-diphenyl-1,10-phenanthroline). The thickness of the electron transport layer is, for example, 15 to 200 nm. The electron injection layer is formed, for example, by using lithium fluoride (LiF). The thickness of the electron injection layer is, for example, 15 to 270 nm.

The electrode layers 14R, 14G and 14B are cathode electrodes, and function also as reflecting mirrors. The electrode layers 14R, 14G and 14B are each formed by using a metallic material high in reflectance. The electrode layers 14R, 14G and 14B are each formed, for example, by using any of magnesium (Mg), silver (Ag) and their alloys. The electrode layers 14R, 14G and 14B are each composed, for example, of a single metal layer which has a thickness of 15 to 55 nm. With the electrode layers 14R, 14G and 14B formed by using such metallic materials high in reflectance, the effect of the resonator structure is enhanced, and light extraction efficiency can be enhanced. As a result, it is possible to suppress power consumption and to prolong the useful lives of the red light emitting section 10R, the green light emitting section 10G and the blue light emitting section 10B. Note that where the light extraction efficiency and the resistance values of the electrode layers 14R, 14G and 14B at the time when the thicknesses of the electrode layers 14R, 14G and 14B are 15 nm are taken as reference, the upper limit of the thicknesses of the electrode layers 14R, 14G and 14B such that the product of current ratio (reciprocal of relative efficiency) and resistance ratio is not less than 1 is 55 nm.

The transparent layers 15R, 15G and 15B, the transparent layers 16R, 16G and 16B and the transparent layers 17R, 17G and 17B are provided on the light extraction side in the light emitting device 1. The thicknesses of the transparent layers 15R, 15G and 15B are, for example, 30 to 450 nm; the thicknesses of the transparent layers 16R, 16G and 16B are, for example, 30 to 380 nm; and the thicknesses of the transparent layers 17R, 17G and 17B are, for example, 500 to 10,000 nm.

The transparent layers 15R, 15G and 15B, the transparent layers 16R, 16G and 16B and the transparent layers 17R, 17G and 17B are each formed, for example, by using a transparent conductive material or a transparent dielectric material. Examples of the transparent conductive material used for the transparent layers 15R, 15G and 15B, the transparent layers 16R, 16G and 16B and the transparent layers 17R, 17G and 17B include ITO (Indium Tin Oxide), and an oxide of indium and zinc (IZO). Examples of the transparent dielectric material used for the transparent layers 15R, 15G and 15B, the transparent layers 16R, 16G and 16B and the transparent layers 17R, 17G and 17B include silicon oxide ($SiO_2$), silicon oxynitride (SiON) and silicon nitride (SiN). The transparent layers 15R, 15G and 15B, the transparent layers 16R, 16G and 16B and the transparent layers 17R, 17G and 17B may function as cathode electrodes, or may be configured to function as passivation films. Low-refractive-index materials such as MgF and NaF may also be used for the transparent layers 15R, 15G and 15B, the transparent layers 16R, 16G and 16B and the transparent layers 17R, 17G and 17B.

A layer having a film thickness of not less than 1 µm may be provided on the upper side of the transparent layers 17R, 17G and 17B. This layer is formed, for example, by using a transparent conductive material, a transparent insulating material, a resin material, a glass or the like. This layer may include air. With such a layer provided, the resonator structures configured between the electrode layers 12R, 12G and 12B and the transparent layers 17R, 17G and 17B can be protected from external interference.

Figure 2:
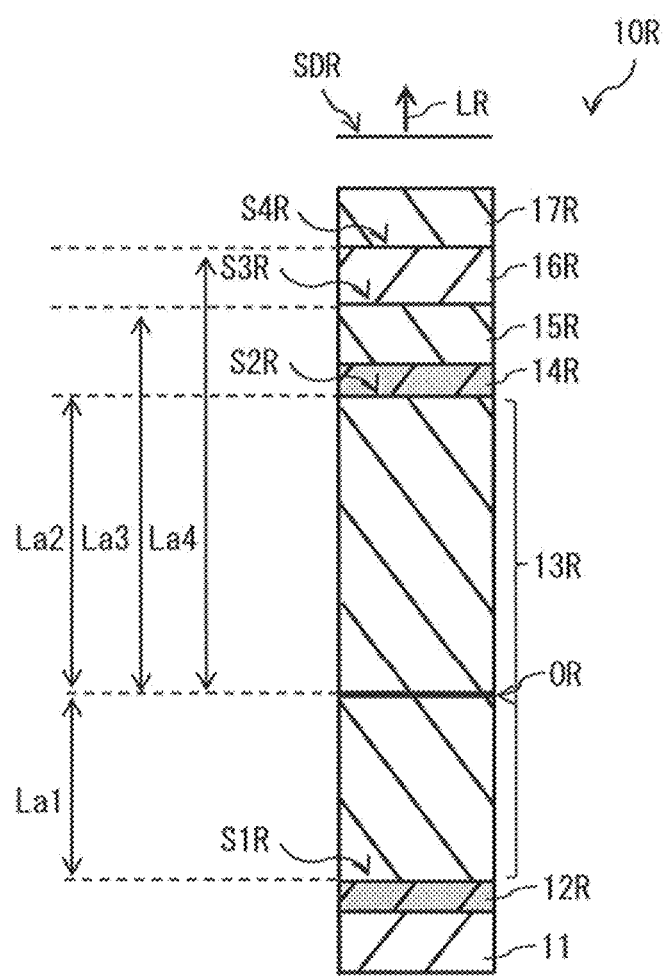
FIG. 2 is a sectional view depicting the configuration of a red light emitting section illustrated in FIG. 1.
Figure 3:
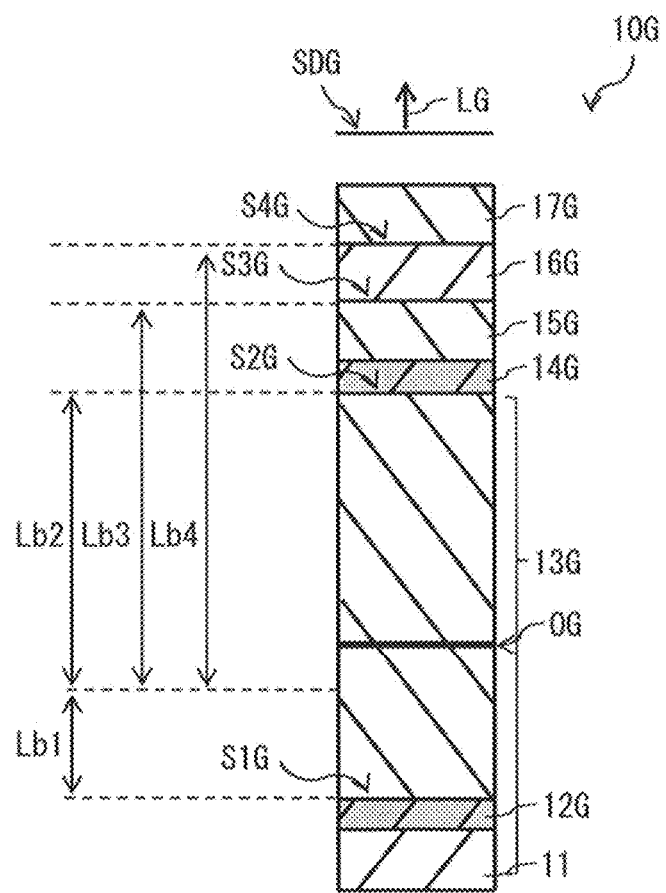
FIG. 3 is a sectional view depicting the configuration of a green light emitting section illustrated in FIG. 1.
Figure 4:
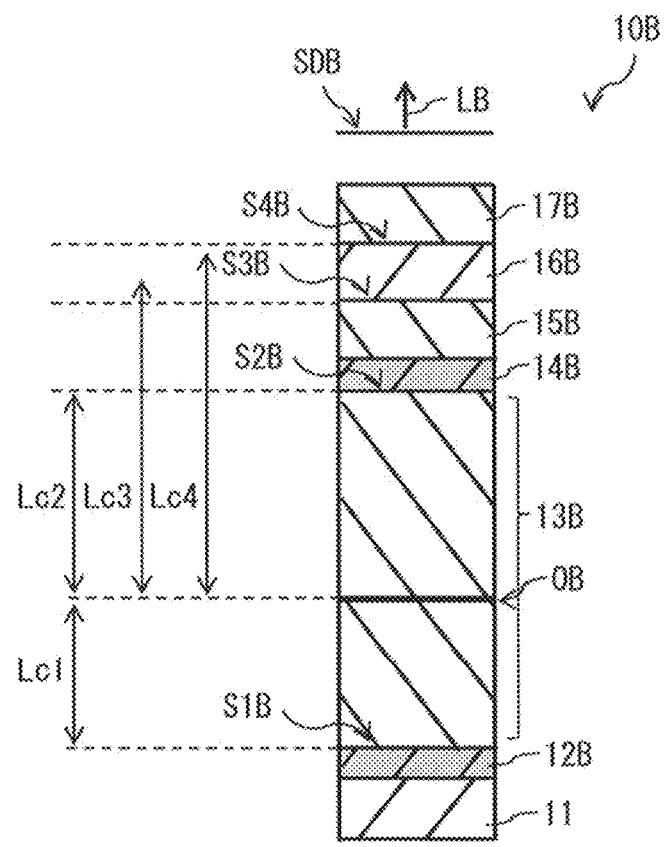
FIG. 4 is a sectional view depicting the configuration of a blue light emitting section illustrated in FIG. 1.

The resonator structures of the red light emitting section 10R, the green light emitting section 10G and the blue light emitting section 10B will be described below. FIG. 2 is a sectional view depicting the configuration of the red light emitting section 10R. FIG. 3 is a sectional view depicting the configuration of the green light emitting section 10G. FIG. 4 is a sectional view depicting the configuration of the blue light emitting section 10B.

The red light emitting section 10R includes a first reflective interface S1R, a second reflective interface S2R, a third reflective interface S3R, a fourth reflective interface S4R and a light extraction surface SDR in this order from the substrate 11 side. The third reflective interface S3R and the fourth reflective interface S4R are included in a laminate including the transparent layer 15R, the transparent layer 16R and the transparent layer 17R. In this instance, a microcavity structure is formed by a structure including the first reflective interface S1R, the second reflective interface S2R, the third reflective interface S3R and the fourth reflective interface S4R. The microcavity structure has, for example, an effect to intensify light of a specified wavelength (e.g., light in the red wavelength region) by utilizing the resonance of light generated between the electrode layer 12R and the electrode layer 14R. A light emission center OR of the red light emitting layer 131R is provided between the first reflective interface S1R and the second reflective interface S2R. In other words, the red light emitting layer 131R is provided between the first reflective interface S1R and the light extraction surface SDR which are opposed to each other. The first reflective interface S1R is an interface between the electrode layer 12R and the red organic layer 13R. The second reflective interface S2R is an interface between the red organic layer 13R and the electrode layer 14R. The third reflective interface S3R is an interface between the transparent layer 15R and the transparent layer 16R. The fourth reflective interface S4R is an interface between the transparent layer 16R and the transparent layer 17R. The light extraction surface SDR is an outermost surface of the red light emitting section 10R. The outermost surface of the red light emitting section 10R is in contact with an air layer, for example. Light emitted from the red light emitting section 10R through the transparent layers 15R, 16R and 17R is extracted from the light extraction surface SDR.

The green light emitting section 10G includes a first reflective interface S1G, a second reflective interface S2G, a third reflective interface S3G, a fourth reflective interface S4G and a light extraction surface SDG in this order from the substrate 11 side. The third reflective interface S3G and the fourth reflective interface S4G are included in a laminate including the transparent layer 15G, the transparent layer 16G and the transparent layer 17G. In this instance, a microcavity structure is formed by a structure including the first reflective interface S1G, the second reflective interface S2G, the third reflective interface S3G and the fourth reflective interface S4G. the microcavity structure has, for example, an effect to intensify light of a specified wavelength (e.g., light in the green wavelength region) by utilizing the resonance of light generated between the electrode layer 12G and the electrode layer 14G. A light emission center OG of the green light emitting layer 131G is provided between the first reflective interface S1G and the second reflective interface S2G. In other words, the green light emitting layer 131G is provided between the first reflective interface S1G and the light extraction surface SDG which are opposed to each other. The first reflective interface S1G is an interface between the electrode layer 12G and the green organic layer 13G. The second reflective interface S2G is an interface between the green organic layer 13G and the electrode layer 14G. The third reflective interface S3G is an interface between the transparent layer 15G and the transparent layer 16G. The fourth reflective interface S4G is an interface between the transparent layer 16G and the transparent layer 17G. The light extraction surface SDG is an outermost surface of the green light emitting section 10G. The outermost surface of the green light emitting section 10G is in contact with an air layer, for example. Light emitted from the green light emitting section 10G through the transparent layers 15G, 16G and 17G is extracted from the light extraction surface SDG.

The blue light emitting section 10B includes a first reflective interface S1B, a second reflective interface S2B, a third reflective interface S3B, a fourth reflective interface S4B and a light extraction surface SDB in this order from the substrate 11 side. The third reflective interface S3B and the fourth reflective interface S4B are included in a laminate including the transparent layer 15B, the transparent layer 16B and the transparent layer 17B. In this instance, a microcavity structure is formed by a structure including the first reflective interface S1B, the second reflective interface S2B, the third reflective interface S3B and the fourth reflective interface S4B. The microcavity structure has, for example, an effect to intensify light of a specified wavelength (e.g., light in the blue wavelength region) by utilizing the resonance of light generated between the electrode layer 12B and the electrode layer 14B. A light emission center OB of the blue light emitting layer 131B is provided between the first reflective interface S1B and the second reflective interface S2B. In other words, the blue light emitting layer 131B is provided between the first reflective interface S1B and the light extraction surface SDB which are opposed to each other. The first reflective interface S1B is an interface between the electrode layer 12B and the blue organic layer 13B. The second reflective interface S2B is an interface between the blue organic layer 13B and the electrode layer 14B. The third reflective interface S3B is an interface between the transparent layer 15B and the transparent layer 16B. The fourth reflective interface S4B is an interface between the transparent layer 16B and the transparent layer 17B. The light extraction surface SDB is an outermost surface of the blue light emitting section 10B. The outermost surface of the blue light emitting section 10B is in contact with an air layer, for example. Light emitted from the blue light emitting section 10B through the transparent layers 15B, 16B and 17B is extracted from the light extraction surface SDB.

The first reflective interfaces S1R, S1G and S1B and the second reflective interfaces S2R, S2G and S2B each include a reflective film formed by using a metal. The third reflective interfaces S3R, S3G and S3B and the fourth reflective interfaces S4R, S4G and S4B each include an interface having a refractive index difference of not less than 0.15, for example.

First Reflective Interfaces S1R, S1G and S1B

Let the electrode layers 12R, 12G and 12B be each formed by using aluminum (Al) having a refractive index of 0.73 and an extinction coefficient of 5.91, and let the red organic layer 13R, the green organic layer 13G and the blue organic layer 13B be each formed by using a material having a refractive index of 1.75. In this instance, the first reflective interface S1R is disposed at a position of an optical path La1 from the light emission center OR, the first reflective interface S1G is disposed at a position of an optical path Lb1 from the light emission center OG, and the first reflective interface S1B is disposed at a position of an optical path Lc1 from the light emission center OB.

The optical path La1 is set in such a manner that the light with a center wavelength $\lambda a$ in the light emission spectrum of the red light emitting layer 131R (the light in the red wavelength region (first wavelength band)) is intensified by interference between the first reflective interface S1R and the light emission center OR. The optical path Lb1 is set in such a manner that the light with a center wavelength $\lambda b$ in the light emission spectrum of the green light emitting layer 131G (the light in the green wavelength region (first wavelength band)) is intensified by interference between the first reflective interface S1G and the light emission center OG. The optical path Lc1 is set in such a manner that the light with a center wavelength $\lambda c$ in the light emission spectrum of the blue light emitting layer 131B (the light in the blue wavelength region (second wavelength band)) is intensified by interference between the first reflective interface S1B and the light emission center OB.

Specifically, the optical paths La1, Lb1 and Lc1 satisfy the following expressions (1) to (6).

$$2La1/\lambda a1 + \varphi a1/(2\pi) = Na \quad (1)$$

$$\lambda a - 150 < \lambda a1 < \lambda a + 80 \quad (2)$$

$$2Lb1/\lambda b1 + \varphi b1/(2\pi) = Nb \quad (3)$$

$$\lambda b - 150 < \lambda b1 < \lambda b + 80 \quad (4)$$

$$2Lc1/\lambda c1 + \varphi c1/(2\pi) = Nc \quad (5)$$

$$\lambda c - 150 < \lambda c1 < \lambda c + 80 \quad (6)$$

where

Na, Nb and Nc are each an integer of not less than 0;

the unit of $\lambda a$, $\lambda a1$, $\lambda b$, $\lambda b1$, $\lambda c$ and $\lambda c1$ is nm;

$\varphi a1$ is the phase change when the light emitted from the red light emitting layer 131R is reflected by the first reflective interface S1R;

$\varphi b1$ is the phase change when the light emitted from the green light emitting layer 131G is reflected by the first reflective interface S1G;

$\varphi c1$ is the phase change when the light emitted from the blue light emitting layer 131B is reflected by the first reflective interface S1B;

$\lambda a1$ is a wavelength satisfying the expression (2);

$\lambda b1$ is a wavelength satisfying the expression (4); and $\lambda c1$ is a wavelength satisfying the expression (6).

$\varphi a1$, $\varphi b1$ and $\varphi c1$ can be calculated by use of n0 and k values of the complex refractive indexes N=n0−jk (n0 is refractive index, and k is extinction coefficient) of the constituent materials of the electrode layers 12R, 12G and 12B and the refractive indexes of the red organic layer 13R, the green organic layer 13G and the blue organic layer 13B (see, for example, Principles of Optics, Max Born and Emil Wolf, 1974 (PERGAMON PRESS)). The refractive indexes of the constituent materials can be measured by use of a spectroscopic ellipsometry measuring instrument.

When the values of Na, Nb and Nc are high, the so-called microcavity (minute resonator) effect cannot be obtained. Therefore, it is preferable that Na=0, Nb=0, and Nc=0. In the case where the optical path La1 satisfies the above expressions (1) and (2), $\lambda a1$ can be largely deviated from the center wavelength $\lambda a$. Similarly, in the case where the optical path Lb1 satisfies the above expressions (3) and (4), λ1 can be largely deviated from the center wavelength λb. Besides, in the case where the optical path Lc1 satisfies the above expressions (5) and (6), λc1 can be largely deviated from the center wavelength λc.

Second Reflective Interfaces S2R, S2G and S2B

Let the red organic layer 13R, the green organic layer 13G and the blue organic layer 13B be each formed by using a material having a refractive index of 1.75, and let the electrode layers 14R, 14G and 14B be each formed by using silver (Ag) having a refractive index of 0.13 and an extinction coefficient of 3.96. In this instance, the second reflective interface S2R is disposed at a position of an optical path La2 from the light emission center OR, the second reflective interface S2G is disposed at a position of an optical path Lb2 from the light emission center OG, and the second reflective interface S2B is disposed at a position of an optical path Lc2 from the light emission center OB.

The optical path La2 is set in such a manner that the light with a center wavelength λa in the light emission spectrum of the red light emitting layer 131R (the light in the red wavelength region (first wavelength band)) is intensified by interference between the second reflective interface S2R and the light emission center OR. The optical path Lb2 is set in such a manner that the light with a center wavelength λb in the light emission spectrum of the green light emitting layer 131G (the light in the green wavelength region (first wavelength band)) is intensified by interference between the second reflective interface S2G and the light emission center OG. The optical path Lc2 is set in such a manner that the light with a center wavelength λc in the light emission spectrum of the blue light emitting layer 131B (the light in the blue wavelength region (second wavelength band)) is intensified by interference between the second reflective interface S2B and the light emission center OB.

Specifically, the optical paths La2, Lb2 and Lc2 satisfy the following expressions (7) to (12).

$$2La2/\lambda a2 + \varphi a2/(2\pi) = Ma \qquad (7)$$

$$\lambda a - 80 < \lambda a2 < \lambda a + 80 \qquad (8)$$

$$2Lb2/\lambda b2 + \varphi b2/(2\pi) = Mb \qquad (9)$$

$$\lambda b - 80 < \lambda b2 < \lambda b + 80 \qquad (10)$$

$$2Lc2/\lambda c2 + \varphi c2/(2\pi) = Mc \qquad (11)$$

$$\lambda c - 80 < \lambda c2 < \lambda c + 80 \qquad (12)$$

where
Ma, Mb and Mc are each an integer of not less than 0;
the unit of λa, λa2, λb, λb2, λc and λc2 is nm;
$\varphi a2$ is the phase change when the light emitted from the red light emitting layer 131R is reflected by the second reflective interface S2R;
$\varphi b2$ is the phase change when the light emitted from the green light emitting layer 131G is reflected by the second reflective interface S2G;
$\varphi c2$ is the phase change when the light emitted from the blue light emitting layer 131B is reflected by the second reflective interface S2B;
λa2 is a wavelength satisfying the expression (8);
λb2 is a wavelength satisfying the expression (10); and
λc2 is a wavelength satisfying the expression (12).
$\varphi a2$, $\varphi b2$ and $\varphi c2$ can be determined by a method similar to that for $\varphi a1$, $\varphi b1$ and $\varphi c1$. When the values of Ma, Mb and Mc are high, the so-called microcavity (minute resonator) effect cannot be obtained. Therefore, it is preferable that Ma=0, Mb=0, and Mc=0.

Here, it is presumed that Na=0, Nb=0, Nc=0, Ma=0, Mb=0, and Mc=0. In this case, a microcavity structure with a minimum resonance condition is formed by a structure including the first reflective interface S1R, the second reflective interface S2R, the third reflective interface S3R and the fourth reflective interface S4R. In this instance, the microcavity structure with the minimum resonance condition of the red light emitting section 10R is configured in such a manner that the first reflective interface S1R and the second reflective interface S2R intensify light in the red wavelength region, and that the third reflective interface S3R and the fourth reflective interface S4R weaken the light in the red wavelength region. Similarly, a microcavity structure with a minimum resonance condition is formed by a structure including the first reflective interface S1G, the second reflective interface S2G, the third reflective interface S3G and the fourth reflective interface S4G. In this instance, the microcavity structure with the minimum resonance condition of the green light emitting section 10G is configured in such a manner that the first reflective interface S1G and the second reflective interface S2G intensify light in the green wavelength region, and that the third reflective interface S3G and the fourth reflective interface S4G weaken the light in the green wavelength region. Further, a microcavity structure with a minimum resonance condition is formed by a structure including the first reflective interface S1B, the second reflective interface S2B, the third reflective interface S3B and the fourth reflective interface S4B. In this instance, the microcavity structure with the minimum resonance condition of the blue light emitting section 10B is configured in such a manner that the first reflective interface S1B and the second reflective interface S2B intensify light in the blue wavelength region, and that the third reflective interface S3B and the fourth reflective interface S4B intensify the light in the blue wavelength region.

In the case where the optical path La1 satisfies the above-mentioned expressions (1) and (2) and where the optical path La2 satisfies the above-mentioned expressions (7) and (8), a peak of transmittance is generated at a predetermined wavelength due to an amplifying effect of the first reflective interface S1R and the second reflective interface S2R. In the case where the optical path Lb1 satisfies the above-mentioned expressions (3) and (4) and where the optical path Lb2 satisfies the above-mentioned expressions (9) and (10), a peak of transmittance is generated at a predetermined wavelength due to an amplifying effect of the first reflective interface S1G and the second reflective interface S2G. In the case where the optical path Lc1 satisfies the above-mentioned expressions (5) and (6) and where the optical path Lc2 satisfies the above-mentioned expressions (11) and (12), a peak of transmittance is generated at a predetermined wavelength due to an amplifying effect of the first reflective interface S1B and the second reflective interface S2B.

Third Reflective Interfaces S3R, S3G and S3B

The optical path La3 is set, for example, in such a manner that the light with a center wavelength λa in the light emission spectrum of the red light emitting layer 131R is weakened by interference between the third reflective interface S3R and the light emission center OR. In this instance, the optical path between the second reflective interface S2R and the third reflective interface S3R is not more than the center wavelength λa of the light emitted from the red light emitting layer 131R. The optical path Lb3 is set, for example, in such a manner that the light with a center wavelength λb in the light emission spectrum of the green light emitting layer 131G is weakened by interference between the third reflective interface S3G and the light emission center OG. In this instance, the optical path between the second reflective interface S2G and the third reflective interface S3G is not more than the center wavelength λb of the light emitted from the green light emitting layer 131G. The optical path Lc3 is set, for example, in such a manner that the light with a center wavelength λc in the light emission spectrum of the blue light emitting layer 131B is intensified by interference between the third reflective interface S3B and the light emission center OB. In this instance, the optical path between the second reflective interface S2B and the third reflective interface S3B is not more than the center wavelength λc of the light emitted from the blue light emitting layer 131B.

The optical paths La3, Lb3 and Lc3 satisfy, for example, the following expressions (13) to (18).

$$2La3/\lambda a3 + \varphi a3/(2\pi) = Ka + \tfrac{1}{2} \quad (13)$$

$$\lambda a - 150 < \lambda a3 < \lambda a + 150 \quad (14)$$

$$2Lb3/\lambda b3 + \varphi b3/(2\pi) = Kb + \tfrac{1}{2} \quad (15)$$

$$\lambda b - 150 < \lambda b3 < \lambda b + 150 \quad (16)$$

$$2Lc3/\lambda c3 + \varphi c3/(2\pi) = Kc \quad (17)$$

$$\lambda c - 150 < \lambda c3 < \lambda c + 150 \quad (18)$$

where
Ka, Kb and Kc are each an integer of not less than 0;
the unit of λa, λa3, λb, λb3, λc and λc3 is nm;
φa3 is the phase change when the light emitted from the red light emitting layer 131R is reflected by the third reflective interface S3R;
φb3 is the phase change when the light emitted from the green light emitting layer 131G is reflected by the third reflective interface S3G;
φc3 is the phase change when the light emitted from the blue light emitting layer 131B is reflected by the third reflective interface S3B;
λa3 is a wavelength satisfying the expression (14);
λb3 is a wavelength satisfying the expression (16); and
λc3 is a wavelength satisfying the expression (18).
φa3, φb3 and φc3 can be determined by a method similar to that for φa1, φb1 and φc1. In the case where the optical paths La3, Lb3 and Lc3 satisfy the above expressions (13) to (18), the light emitting state can be adjusted on the light emitting section (the red light emitting section 10R, the green light emitting section 10G, the blue light emitting section 10B) basis. Thus, by the addition of the reflection on the third reflective interface S3R, the light generated in the red light emitting layer 131R is weakened, and the half-value width of the spectrum is broadened. In addition, by the addition of the reflectance on the third reflective interface S3G, the light generated in the green light emitting layer 131G is weakened, and the half-value width of the spectrum is broadened. By the addition of the reflection on the third reflective interface S3B, the light generated in the blue light emitting layer 131B is intensified, and the half-value width of the spectrum is narrowed.

Fourth Reflective Interfaces S4R, S4G and S4B

The optical path La4 is set, for example, in such a manner that the light with a center wavelength λa in the light emission spectrum of the red light emitting layer 131R is weakened by interference between the fourth reflective interface S4R and the light emission center OR. In this instance, the optical path between the second reflective interface S2R and the fourth reflective interface S4R is not more than the center wavelength λa of the light emitted from the red light emitting layer 131R. The optical path Lb4 is set, for example, in such a manner that the light with a center wavelength λb in the light emission spectrum of the green light emitting layer 131G is weakened by interference between the fourth reflective interface S4G and the light emission center OG. In this instance, the optical path between the second reflective interface S2G and the fourth reflective interface S4G is not more than the center wavelength λb of the light emitted from the green light emitting layer 131G. The optical path Lc4 is set, for example, in such a manner that the light with a center wavelength λc in the light emission spectrum of the blue light emitting layer 131B is intensified by interference between the fourth reflective interface S4B and the light emission center OB. In this instance, the optical path between the second reflective interface S2B and the fourth reflective interface S4B is not more than the center wavelength λc of the light emitted from the blue light emitting layer 131B.

$$2La4/\lambda a4 + \varphi a4/(2\pi) = Ja + \tfrac{1}{2} \quad (19)$$

$$\lambda a - 150 < \lambda a4 < \lambda a + 150 \quad (20)$$

$$2Lb4/\lambda b4 + \varphi b4/(2\pi) = Jb + \tfrac{1}{2} \quad (21)$$

$$\lambda b - 150 < \lambda b4 < \lambda b + 150 \quad (22)$$

$$2Lc4/\lambda c4 + \varphi c4/(2\pi) = Jc \quad (23)$$

$$\lambda c - 150 < \lambda c4 < \lambda c + 150 \quad (24)$$

where
Ja, Jb and Jc are each an integer of not less than 0;
the unit of λa, λa4, λb, λb4, λc and λc4 is nm;
φa4 is the phase change when the light emitted from the red light emitting layer 131R is reflected by the fourth reflective interface S4R;
φb4 is the phase change when the light emitted from the green light emitting layer 131G is reflected by the fourth reflective interface S4G;
φc4 is the phase change when the light emitted from the blue light emitting layer 131B is reflected by the fourth reflective interface S4B;
φa4 is a wavelength satisfying the expression (20);
φb4 is a wavelength satisfying the expression (22); and
φc4 is a wavelength satisfying the expression (24).
φa4, φb4 and φc4 can be determined by a method similar to that for φa1, φb1 and φc1. In the case where the optical paths La3, Lb3 and Lc3 satisfy the above-mentioned expressions (13) to (18) and where the optical paths La4, Lb4 and Lc4 satisfy the above expressions (19) to (24), the light emitting state can be adjusted on the light emitting section (the red light emitting section 10R, the green light emitting section 10G, the blue light emitting section 10B) basis. Thus, by the addition of the reflection on the fourth reflective interfaces S4R, S4G and S4B, the peak profiles of the spectra of the lights generated in the red light emitting layer 131R, the green light emitting layer 131G and the blue light emitting layer 131B can be adjusted to desired profiles. As a result, it is possible, for example, to restrain sudden variations in luminance and hue with angle. In addition, for example, by causing the spectrum of the light generated in the light emitting layer to have a steep peak, it is possible to enhance light extraction efficiency. Besides, it is also possible to improve chromaticity point.

Such a light emitting device 1 can be manufactured by forming the electrode layers 12R, 12G and 12B, the organic layers (the red organic layer 13R, the green organic layer 13G, and the blue organic layer 13B), the electrode layers 14R, 14G and 14B, the transparent layers 15R, 15G and 15B, the transparent layers 16R, 16G and 16B and the transparent layers 17R, 17G and 17B in this order over the substrate 11. The red organic layers 13R, the green organic layers 13G and the blue organic layers 13B may be formed by a vapor deposition method or may be formed by printing. In other words, the red organic layers 13R, the green organic layers 13G and the blue organic layers 13B may be printed layers. The electrode layers 14R, 14G and 14B may be composed of a common layer. In this case, the materials and thicknesses of the electrode layers 14R, 14G and 14B are equal to one another. The transparent layers 15R, 15G and 15B may be composed of a common layer. In this case, the materials and thicknesses of the transparent layers 15R, 15G and 15B are equal to one another. The transparent layers 16R, 16G and 16B may be composed of a common layer. In this case, the materials and thicknesses of the transparent layers 16R, 16G and 16B are equal to one another. The transparent layers 17R, 17G and 17B may be composed of a common layer. In this case, the materials and thicknesses of the transparent layers 17R, 17G and 17B are equal to one another.

Operation and Effect

In the light emitting device 1 as above-described, a driving current is injected into each of the light emitting layers (the red light emitting layer 131R, the green light emitting layer 131G, and the blue light emitting layer 131B) of the red light emitting section 10R, the green light emitting section 10G and the blue light emitting section 10B through the electrode layers 12R, 12G and 12B and the electrode layers 14R, 14G and 14B. As a result, in each light emitting layer, recombination of holes and electrons occurs, to produce exitons, thereby emitting light.

Figure 5:
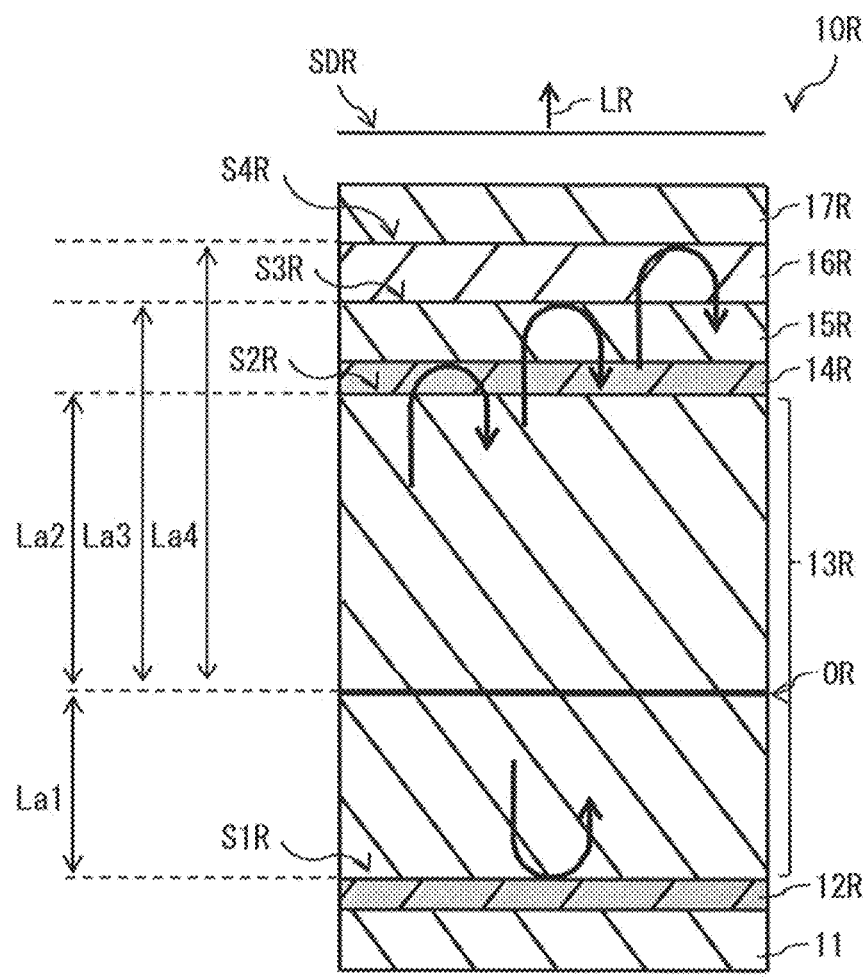
FIG. 5 is a sectional view for explaining an operation of the light emitting device illustrated in FIG. 1.

For example, as illustrated in FIG. 5, the light produced in the red organic layer 13R is subjected to multiple reflection between the first reflective interface S1R and the fourth reflective interface S4R, and is extracted from the light extraction surface SDR. Red light LR is extracted from the light extraction surface SDR in the red light emitting section 10R, green light LG is extracted from the light extraction surface SDG in the green light emitting section 10G, and blue light LB is extracted from the light extraction surface SDB in the blue light emitting section 10B. By additive mixture of the red light LR, the green light LG and the blue light LB, various colors are expressed.

In the light emitting device having such a resonator structure, however, it is difficult to enhance light distribution characteristics, although various structures have been proposed.

For instance, in order that light of a desired wavelength is resonated, a method of setting a film thickness between a light-transmitting electrode and a reflective electrode to thereby enhance light emission efficiency has been proposed (see, for example, WO 01/039554). In addition, an attempt to control the balance of attenuation of three primary colors (red, green and blue) by controlling the film thicknesses of the organic layers and to enhance viewing angle characteristics of chromaticity point of white color has also been made (see, for example, JP 2011-159433A).

However, such a resonator structure functions as an interference filter with a narrow half-value width for the spectrum of the light extracted, and, therefore, the wavelength of the light is largely shifted in the case where the light extraction surface is viewed from an oblique direction. Accordingly, a lowering in light emission intensity or the like is generated depending on the viewing angle, and viewing angle dependency is increased.

In addition, JP 2006-244713A proposes a structure for reducing a change in chromaticity depending on viewing angle. However, although this structure may be applied to monochrome and may be able to reduce dependency of luminance on viewing angle, it is difficult to apply the structure to a sufficiently wide wavelength band. While it may be contemplated to enhance reflectance in order to broaden the wavelength band to which the structure is applicable, in that case, light extraction efficiency is lowered conspicuously.

A method of reducing the angle dependency by adjusting the positional relations in the resonator structure, the light emission position and the like may be contemplated as above-mentioned, but this method may lead to a case where adjustment is difficult. Examples of such a case include a case where wavelength dispersion of refractive index is generated depending on the spectrum of the light emitted from each light emitting layer. In the case of the wavelength dispersion of refractive index, since the refractive index of a constituent material is different for different wavelengths, differences in the effect of the resonator structure would be generated between the red organic EL element, the green organic EL element and the blue organic EL element. For example, in the red organic EL element, the peak of the red light extracted is too steep, and, in the blue organic EL element, the peak of the blue light extracted is too gentle. When the effect of the resonator structure is thus largely differing on the element region basis, the angle dependencies of luminance and chromaticity are increased, and light distribution characteristics are lowered.

On the other hand, in the light emitting device 1 according to the present embodiment, the influence of the third reflective interface S3R and the fourth reflective interface S4R on the light generated in the red light emitting layer 131R and the influence of the third reflective interface S3B and the fourth reflective interface S4B on the light generated in the blue light emitting layer 131B are different from each other. Similarly, in the light emitting device 1 according to the present embodiment, the influence of the third reflective interface S3G and the fourth reflective interface S4G on the light generated in the green light emitting layer 131G and the influence of the third reflective interface S3B and the fourth reflective interface S4B on the light generated in the blue light emitting layer 131B are different from each other. For example, the lights generated in the red light emitting layer 131R, the green light emitting layer 131G and the blue light emitting layer 131B are as follows.

The light generated in the red light emitting layer 131R is weakened by the interferences between the light emission center OR of the red light emitting layer 131R and the third reflective interface S3R and the fourth reflective interface S4R of the red light emitting layer 131R. Similarly, the light generated in the green light emitting layer 131G is weakened by the interferences between the light emission center OG of the green light emitting layer 131G and the third reflective interface S3G and the fourth reflective interface S4G of the green light emitting layer 131G. On the other hand, the light generated in the blue light emitting layer 131B is intensified by the interferences between the light emission center OB of the blue light emitting layer 131B and the third reflective interface S3B and the fourth reflective interface S4B.

As a result, red light LR which is gentle in the vicinity of a peak is extracted from the light extraction surface SDR in the red light emitting section 10R, green light LG which is gentle in the vicinity of a peak is extracted from the light extraction surface SDG in the green light emitting section 10G, and blue light LB which has a steep peak is extracted from the light extraction surface SDB in the blue light emitting section 10B. Therefore, the difference between the effect of the resonator structures of the red light emitting section 10R and the green light emitting section 10G and the effect of the resonator structure of the blue light emitting section 10B is reduced, and angle dependencies of luminance and chromaticity are reduced. Accordingly, light distribution characteristics can be enhanced. In addition, the light emitting device 1 having high light distribution characteristics is also preferable for a display device requiring high image quality, and can enhance the productivity of the display device.

Figure 6:
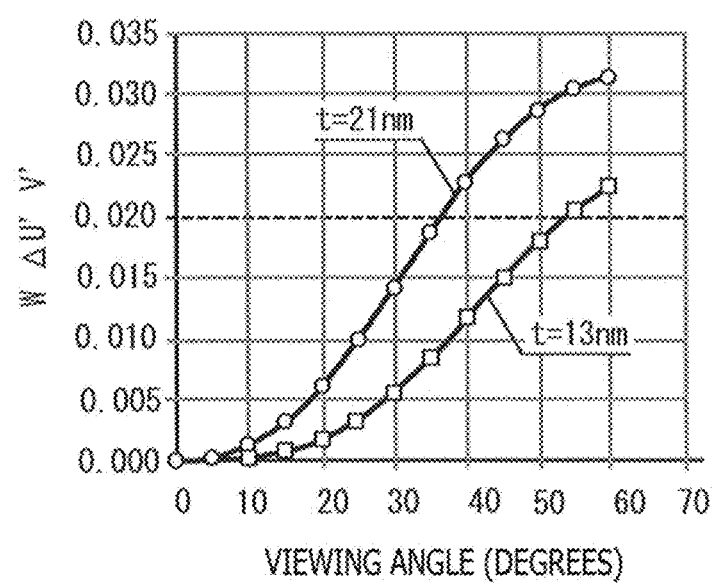
FIG. 6 is a diagram depicting an example of a variation in chromaticity with viewing angle, in a light emitting device according to a comparative example.

FIG. 6 depicts an example of a variation in chromaticity with viewing angle, for a light emitting device according to a comparative example. In the light emitting device according to the comparative example, an electrode layer on the substrate side is composed of a single layer of an Al alloy, and an electrode layer on the light extraction side is composed of a single layer of an Ag alloy. Further, in the light emitting device according to the comparative example, a resonance condition between the electrode layer on the substrate side and the light emission center is 0 (namely, Na, Nb, Nc=0), whereas a resonance condition between the electrode layer on the light extraction surface side and the light emission center is 1 (namely, Ma, Mb, Mc=1), and the third reflective interfaces S3R, S3G and S3B and the fourth reflective interfaces S4R, S4G and S4B are not yet formed. In this instance, in the light emitting device according to the comparative example, second cavity structures are formed by structures including the first reflective interfaces S1R, S1G and S1B and the second reflective interfaces S2R, S2G and S2B. Further, in the light emitting device according to the comparative example, the third reflective interfaces S3R, S3G and S3B and the fourth reflective interfaces S4R, S4G and S4B according to the present embodiment are not provided. FIG. 6 depicts the results when the film thickness t of the electrode layer on the light extraction surface side is 13 nm, and the results when the film thickness t on the light extraction surface side is 21 nm, in the light emitting device according to the comparative example.

Figure 7:
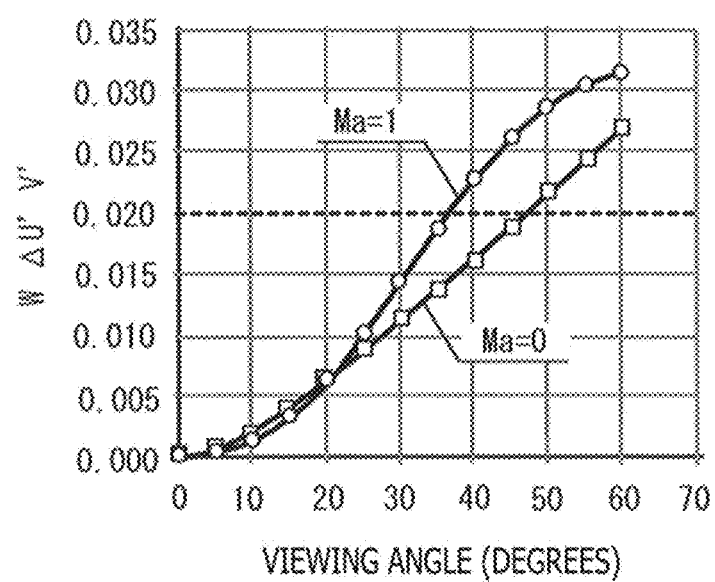
FIG. 7 is another diagram depicting an example of a variation in chromaticity with viewing angle, in the light emitting device according to the comparative example.

FIG. 7 depicts an example of a variation in chromaticity with viewing angle, for the light emitting device according to a comparative example. FIG. 7 depicts the results when the film thickness t of the electrode layer on the light extraction surface side is 21 nm, Na, Nb and Nc are 0, and Ma, Mb and Mc are 1, as well as the results when Ma, Mb and Mc are 0.

Figure 8:
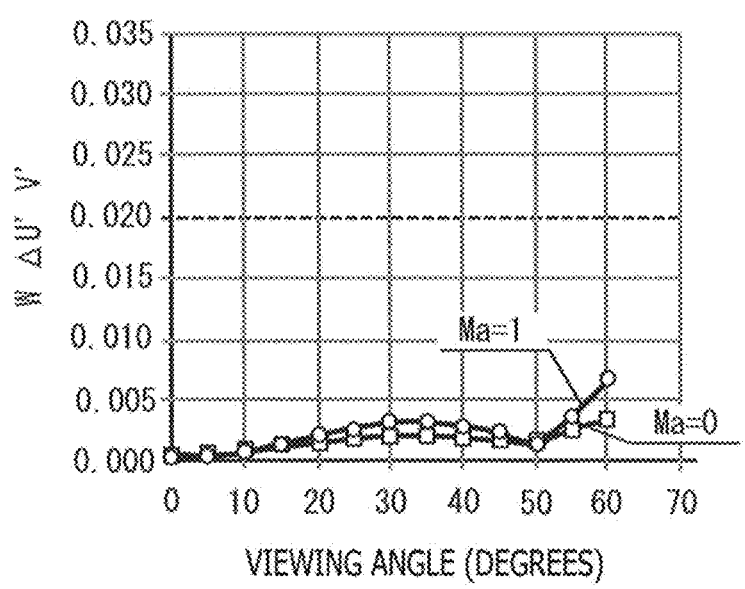
FIG. 8 is a diagram depicting an example of a variation in chromaticity with viewing angle, in the light emitting device illustrated in FIG. 1.

FIG. 8 depicts an example of a variation in chromaticity with viewing angle, for the light emitting device 1 according to the embodiment. In the light emitting device 1 according to the embodiment, the electrode layers 12R, 12G and 12B are each composed of a single layer of an Al alloy, whereas the electrode layers 14R, 14G and 14B are each composed of a single layer of an Ag alloy having a film thickness of 18 nm. Further, for the light emitting device 1 according to the embodiment, FIG. 8 depicts the results when Na, Nb and Nc are 0, and Ma, Mb and Mc are 1, as well as the results when Ma, Mb and Mc are 0. Further, in the light emitting device 1 according to the embodiment, the third reflective interfaces S3R, S3G and S3B and the fourth reflective interfaces S4R, S4G and S4B are provided. Furthermore, in the light emitting device 1 according to the embodiment, the optical path La3 is set in such a manner that the light with a center wavelength λa in the light emission spectrum of the red light emitting layer 131R is weakened by the interference between the third reflective interface S3R and the light emission center OR. The optical path Lb3 is set in such a manner that the light with a center wavelength λb in the light emission spectrum of the green light emitting layer 131G is weakened by the interference between the third reflective interface S3G and the light emission center OG. The optical path Lc3 is set in such a manner that the light with a center wavelength λc in the light emission spectrum of the blue light emitting layer 131B is intensified by the interference between the third reflective interface S3B and the light emission center OB.

From FIG. 6 it is seen that in the case where the film thickness t of the electrode layer on the light extraction surface side is 13 nm, the chromaticity exceeds 0.020, which is one of indexes representing the suitability of viewing angle dependency, at or around a point where the viewing angle exceeds 50 degrees. In addition, it is seen from FIG. 6 that the viewing angle of chromaticity is worsened when the film thickness t of the electrode layer on the light extraction surface side is increased from 13 nm to 21 nm. Thus, it is seen that an increase in the film thickness t of the electrode layer on the light extraction surface side worsens the viewing angle characteristics of chromaticity. The reason lies in that as the film thickness t of the electrode layer on the light extraction surface side is increased, the resonance condition becomes stronger, which, together with the influence of wavelength dispersion of refractive index, leads to a progressive deviation of viewing angle characteristics on a color basis.

Besides, it is seen from FIG. 7 that a lowering of the order Ma of interference is equivalent to a decrease in the film thickness of the electrode layer on the light extraction surface side.

On the other hand, it is seen from FIG. 8 that, in the light emitting device 1 according to the embodiment, viewing angle characteristic is good, notwithstanding the film thickness of the electrode layer on the light extraction surface side is as large as 21 nm. In this instance, the resistance value of the electrode layer on the light extraction surface side in the light emitting device 1 according to the embodiment is 0.62 (=13 nm/21 nm) times the resistance value of the electrode layer on the light extraction surface side in the light emitting device (t=13 nm) according to the comparative example of FIG. 6. Therefore, in the light emitting device 1 according to the embodiment, not only the viewing angle characteristic but also feed performance is good.

From the foregoing, in the present embodiment, in each of the light emitting sections (the red light emitting section 10R, the green light emitting section 10G, and the blue light emitting section 10B), the two reflective interfaces (the third reflective interface S3R, S3G, S3B and the fourth reflective interface S4R, S4G, S4B) are provided on the outer side of the cathode electrode (the electrode layer 14R, 14G, 14B), and a microcavity structure with a minimum resonance condition is formed by a structure which includes the first reflective interface S1R, S1G, S1B and the second reflective interface S2R, S2G, S2B and the third reflective interface S3R, S3G, S3B and the fourth reflective interface S4R, S4G, S4B. This ensures that worsening of the viewing angle characteristics of chromaticity can be restrained, even in the case where the cathode electrode (the electrode layer 14R, 14G, 14B) on the light extraction surface SDR, SDG, SDB side is increased in film thickness.

Further, in the present embodiment, in each of the light emitting sections (the red light emitting section 10R, the green light emitting section 10G, and the blue light emitting section 10B), the microcavity structure is configured in such a manner that the first reflective interface S1R, S1G and the second reflective interface S2R, S2G intensify light in the wavelength band of the light emitted from each light emitting layer (the red light emitting layer 131R, the green light emitting layer 131G), and that the third reflective interface S3R, S3G, S3B and the fourth reflective interface S4R, S4G, S4B weaken light in the wavelength band of the light emitted from each light emitting layer (the red light emitting layer 131R, the green light emitting layer 131G) and intensify light in the wavelength band of the light emitted from the blue light emitting layer 131B.

This ensures that red light LR which is gentle in the vicinity of a peak is extracted from the light extraction surface SDR in the red light emitting section 10R, green light LG which is gentle in the vicinity of a peak is extracted from the light extraction surface SDG in the green light emitting section 10G, and blue light LB which has a steep peak is extracted from the light extraction surface SDB in the blue light emitting section 10B. As a result, angle dependencies of luminance and chromaticity are reduced in the case where the difference between the effect of the resonator structures of the red light emitting section 10R and the green light emitting section 10G and the effect of the resonator structure of the blue light emitting section 10B is reduced. Therefore, both good feed performance and good viewing angle characteristic of chromaticity can be realized. In addition, the light emitting device 1 having high viewing angle characteristics is preferable also for a display device requiring high image quality, and can enhance the productivity of the display device.

Besides, in the present embodiment, the optical path between the second reflective interface S2R and the third reflective interface S3R is not more than the center wavelength $\lambda a$ of the light emitted from the red light emitting layer 131R. Similarly, the optical path between the second reflective interface S2G and the third reflective interface S3G is not more than the center wavelength $\lambda b$ of the light emitted from the green light emitting layer 131G. The optical path between the second reflective interface S2B and the third reflective interface S3B is not more than the center wavelength $\lambda c$ of the light emitted from the blue light emitting layer 131B. As a result, the peak profiles of the spectra of the lights generated in the red light emitting layer 131R, the green light emitting layer 131G and the blue light emitting layer 131B can be adjusted, by the actions of the second reflective interfaces S2R, S2G and S2B and the third reflective interfaces S3R, S3G and S3B and the fourth reflective interfaces S4R, S4G and S4B on the lights generated in the light emitting layers (131R, 131G and 131B). Therefore, worsening of viewing angle characteristics of chromaticity can be restrained, even in the case where the cathode electrodes (the electrode layers 14R, 14G and 14B) on the side of the light extraction surfaces SDR, SDG and SDB are increased in thickness.

In addition, in the present embodiment, the microcavity structure in the red light emitting section 10R is configured such as to satisfy the above-mentioned expressions (1), (2), (7), (8), (13), (14), (19) and (20). Similarly, the microcavity structure in the green light emitting section 10G is configured such as to satisfy the above-mentioned expressions (3), (4), (9), (10), (15), (16), (21) and (22). This ensures that red light LR which is gentle in the vicinity of a peak is extracted from the light extraction surface SDR in the red light emitting section 10R, and green light LG which is gentle in the vicinity of a peak is extracted from the light extraction surface SDG in the green light emitting section 10G. As a result, sudden variations in luminance and chromaticity with angle can be restrained.

Further, in the present embodiment, the microcavity structure in the blue light emitting section 10B is configured such as to satisfy the above-mentioned expressions (5), (6), (11), (12), (17), (18), (23) and (24). This ensures that blue light LB which has a steep peak is extracted from the light extraction surface SDB in the blue light emitting section 10B. Therefore, the difference between the effect of the resonator structures of the red light emitting section 10R and the green light emitting section 10G and the effect of the resonator structure of the blue light emitting section 10B is reduced, and angle dependencies of luminance and chromaticity are reduced. Accordingly, light distribution characteristics can be enhanced. In addition, the light emitting device 1 having high light distribution characteristics is also preferable for a display device requiring high image quality, and can enhance the productivity of the display device.

Figure 9:
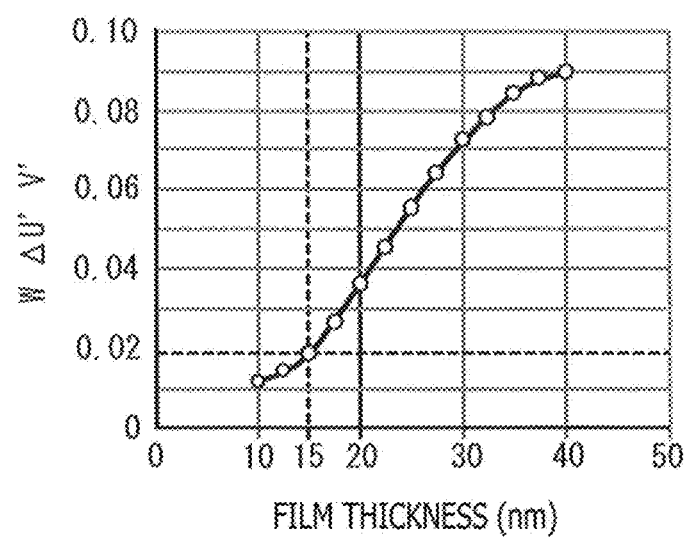
FIG. 9 is a diagram depicting an example of a variation in 45-degree chromaticity viewing angle with film thickness of an electrode on the light extraction surface side, in the light emitting device according to the comparative example.
Figure 10:
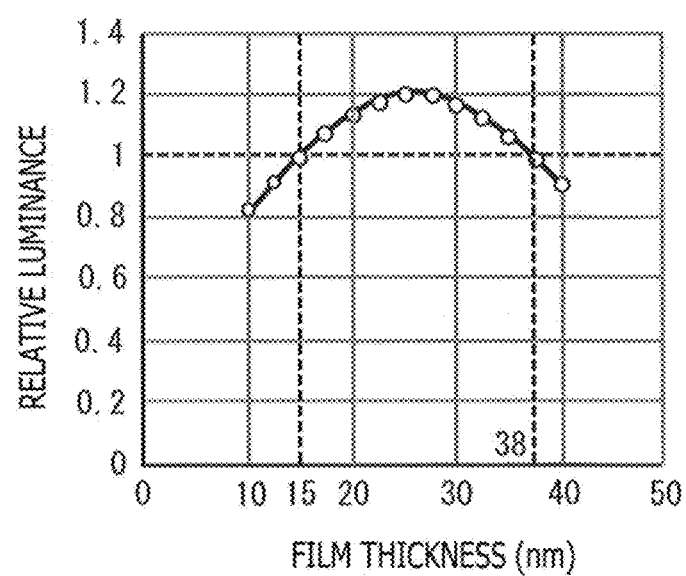
FIG. 10 is a diagram depicting an example of a variation in relative luminance with film thickness of the electrode on the light extraction surface side, in the light emitting device according to the comparative example.

In addition, in the present embodiment, the film thicknesses of the electrode layers 14R, 14G and 14B are not less than 15 nm. This makes it possible to enhance feed performance without worsening the angle dependency of chromaticity. The reason will be described here referring to FIGS. 9 and 10. FIG. 9 depicts an example of a variation in 45-degree chromaticity viewing angle with film thickness of an electrode on the light extraction surface side in the light emitting device according to a comparative example. FIG. 10 depicts an example of a variation in relative luminance with film thickness of an electrode on the light extraction surface side in the light emitting device according to the comparative example. FIGS. 9 and 10 depict the results obtained by using the same light emitting device as the light emitting device used in FIG. 6. It is seen from FIG. 9 that in order that the chromaticity is not more than 0.020, which is one of indexes representing the suitability of viewing angle dependency, the film thickness of the electrode on the light extraction surface side should be less than 15 nm. In other words, in the light emitting device according to the comparative example, it has been extremely difficult, in practice, to set the film thickness of the electrode on the light extraction surface side to 15 nm or above. On the other hand, in the present embodiment, the angle dependency of chromaticity is not worsened even in the case where the film thicknesses of the electrode layers 14R, 14G and 14B are 15 nm or above. It is to be noted, however, that as depicted in FIG. 10, when the film thickness of the electrode on the light extraction surface side is greater than 38 nm, the luminance is lower than the luminance at the time when the film thickness of the electrode on the light extraction surface side is 15 nm. Therefore, in the present embodiment, also, the film thicknesses of the electrode layers 14R, 14G and 14B are set in the range of 15 to 38 nm, whereby the angle dependencies of luminance and chromaticity are not worsened.

Besides, in the present embodiment, the substrate 11 is a circuit substrate provided with circuits (pixel circuits 18-1) for driving the red light emitting layers 131R, the green light emitting layers 131G and the blue light emitting layers 131B. Here, the light emitting device 1 is a top emission type light emitting device. As a result, the lights emitted from the red light emitting layers 131R, the green light emitting layers 131G and the blue light emitting layers 131B are not shielded by the pixel circuits 18-1 in the circuit substrate, and, therefore, a high light extraction efficiency can be obtained.

In addition, in the present embodiment, it is preferable that the red light emitting layers 131R, the green light emitting layers 131G and the blue light emitting layers 131B are printed layers. Since organic layers undergo a drying step or the like, differences in their thickness on a region basis are liable to be generated in the organic layers. In other words, a film thickness distribution is liable to be generated in the organic layers. On the other hand, in the present embodiment, since the red light emitting layers 131R, the green light emitting layers 131G and the blue light emitting layers 131B are printed layers, differences in the effect of the resonator structure on a light emitting element basis due to the film thickness distribution in the red light emitting layers 131R, the green light emitting layers 131G and the blue light emitting layers 131B can be adjusted.

2. Modifications

Modifications of the present embodiment will be described below. In the following description, the same components as those in the above-described embodiment are denoted by the same reference symbols as used above, and descriptions of them will be omitted.

Figure 11:
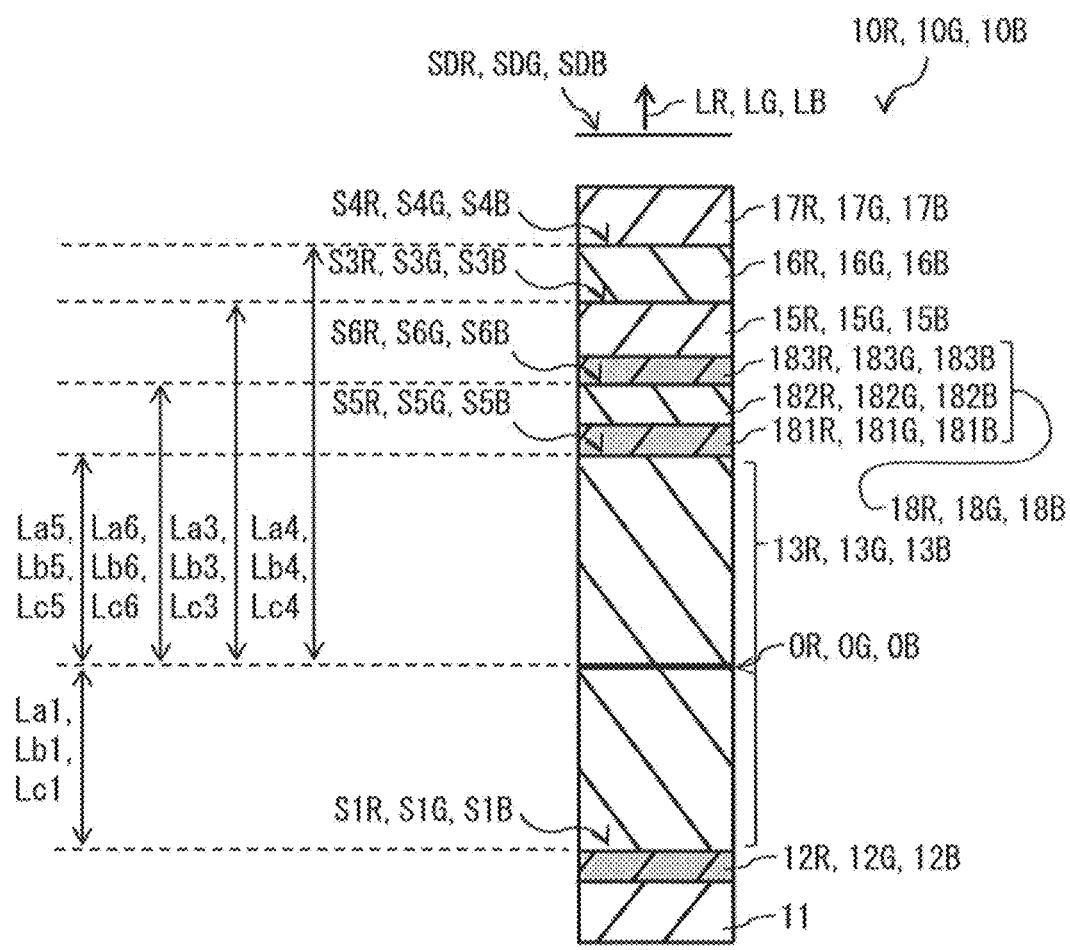
FIG. 11 is a sectional view depicting a modification of the configuration of the light emitting section illustrated in FIG. 1.

In the above-described embodiment, the electrode layers 14R, 14G and 14B have been each configured by using a single metal layer having a film thickness of not less than 15 nm. In the above embodiment, however, the electrode layers 14R, 14G and 14B may each include a laminate of a plurality of conducive layers. In the above embodiment, for example, as depicted in FIG. 11, a laminate 18R may be provided in place of the electrode layer 14R. Similarly, in the above embodiment, for example, as depicted in FIG. 11, a laminate 18G may be provided in place of the electrode layer 14G. Further, in the above embodiment, for example, as depicted in FIG. 11, a laminate 18B may be provided in place of the electrode layer 14B.

The laminate 18R is composed, for example, of a laminate including a metal layer 181R, a transparent layer 182R and a metal layer 183R, as illustrated in FIG. 11. The laminate 18G is composed, for example, of a laminate including a metal layer 181G, a transparent layer 182G and a metal layer 183G, as depicted in FIG. 11. The laminate 18B is composed, for example, of a laminate including a metal layer 181B, a transparent layer 182B and a metal layer 183B, as depicted in FIG. 11.

The metal layers 181R, 181G and 181B are each formed by using a metallic material high in reflectance. The metal layers 181R, 181G and 181B are each formed, for example, by using any of magnesium (Mg), silver (Ag) and their alloys. The metal layers 181R, 181G and 181B are thicker than the metal layers 183R, 183G and 183B. The thicknesses of the metal layers 181R, 181G and 181B are, for example, 5 to 50 nm. With the metal layers 181R, 181G and 181B each formed by use of such a metallic material high in reflectance, the effect of the resonator structures is enhanced, and light extraction efficiency can be enhanced. As a result, it is possible to restrain power consumption and to prolong the useful lives of the red light emitting section 10R, the green light emitting section 10G and the blue light emitting section 10B.

The transparent layers 182R, 182G and 182B are each formed by using a transparent conductive material. Examples of the transparent conductive material used for the transparent layers 182R, 182G and 182B include ITO, and an oxide of indium and zinc (IZO). The thicknesses of the transparent layers 182R, 182G and 182B are, for example, 30 to 600 nm. The transparent layer 182R is in contact with the metal layers 181R and 183R. The transparent layer 182G is in contact with the metal layers 181G and 183G. The transparent layer 182B is in contact with the metal layers 181B and 183B.

The metal layers 183R, 183G and 183B are each formed by using a metallic material high in reflectance. Examples of the metallic material used for the metal layers 183R, 183G and 183B include, for example, magnesium (Mg), silver (Ag) and their alloys. The total thicknesses of the metal layers 181R, 181G and 181B and the metal layers 183R, 183G and 183B are, for example, not less than 15 nm. The thicknesses of the metal layers 183R, 183G and 183B are, for example, 5 to 20 nm. The metal layer 183R is electrically connected to the metal layer 181R through the transparent layer 182R. The metal layer 183G is electrically connected to the metal layer 181G through the transparent layer 182G. The metal layer 183B is electrically connected to the metal layer 181B through the transparent layer 182B.

The resonator structures of the red light emitting section 10R, the green light emitting section 10G and the blue light emitting section 10B will be described below.

The red light emitting section 10R includes the first reflective interface S1R, the fifth reflective interface S5R, the sixth reflective interface S6R, the third reflective interface S3R, the fourth reflective interface S4R and the light extraction surface SDR in this order from the substrate 11 side. In this instance, a microcavity structure is formed by a structure which includes the first reflective interface S1R, the fifth reflective interface S5R, the sixth reflective interface S6R, the third reflective interface S3R and the fourth reflective interface S4R. The light emission center OR of the red light emitting layer 131R is provided between the first reflective interface S1R and the fifth reflective interface S5R. In other words, the red light emitting layer 131R is provided between the first reflective interface S1R and the light extraction surface SDR which are opposed to each other. The fifth reflective interface S5R is an interface between the red organic layer 13R and the metal layer 181R. The sixth reflective interface S6R is an interface between the transparent layer 182R and the metal layer 183R.

The green light emitting section 10G includes the first reflective interface S1G, the fifth reflective interface S5G, the sixth reflective interface S6G, the third reflective interface S3G, the fourth reflective interface S4G and the light extraction surface SDG in this order from the substrate 11 side. In this instance, a microcavity structure is formed by a structure which includes the first reflective interface S1G, the fifth reflective interface S5G, the sixth reflective interface S6G, the third reflective interface S3G and the fourth reflective interface S4G. The light emission center OG of the green light emitting layer 131G is provided between the first reflective interface S1G and the fifth reflective interface S5G. In other words, the green light emitting layer 131G is provided between the first reflective interface S1G and the light extraction surface SDG which are opposed to each other. The fifth reflective interface S5G is an interface between the green organic layer 13G and the metal layer 181G. The sixth reflective interface S6G is an interface between the transparent layer 182G and the metal layer 183G.

The blue light emitting section 10B includes the first reflective interface S1B, the fifth reflective interface S5B, the sixth reflective interface S6B, the third reflective interface S3B, the fourth reflective interface S4B and the light extraction surface SDB in this order from the substrate 11 side. In this instance, a microcavity structure is formed by a structure which includes the first reflective interface S1B, the fifth reflective interface S5B, the sixth reflective interface S6B, the third reflective interface S3B and the fourth reflective interface S4B. The light emission center OB of the blue light emitting layer 131B is provided between the first reflective interface S1B and the fifth reflective interface S5B. In other words, the blue light emitting layer 131B is provided between the first reflective interface S1B and the light extraction surface SDB which are opposed to each other. The fifth reflective interface S5B is an interface between the blue organic layer 13B and the metal layer 181B. The sixth reflective interface S6B is an interface between the transparent layer 182B and the metal layer 183B.

The fifth reflective interfaces S5R, S5G and S5B and the sixth reflective interfaces S6R, S6G and S6B each include a reflective film formed by using a metal.

Fifth Reflective Interfaces S5R, S5G and S5B

Let the red organic layer 13R, the green organic layer 13G and the blue organic layer 13B be each formed by using a material having a refractive index of 1.75, and let the metal layers 181R, 181G and 181B be each formed by using silver (Ag) having a refractive index of 0.13 and an extinction coefficient of 3.96. In this instance, the fifth reflective interface S5R is disposed at a position of an optical path La5 from the light emission center OR, the fifth reflective interface S5G is disposed at a position of an optical path Lb5 from the light emission center OG, and the fifth reflective interface S5B is disposed at a position of an optical path Lc5 from the light emission center OB.

The optical path La5 is set in such a manner that the light with a center wavelength $\lambda a$ in the light emission spectrum of the red light emitting layer 131R is intensified by interference between the fifth reflective interface S5R and the light emission center OR. The optical path Lb5 is set in such a manner that the light with a center wavelength $\lambda b$ in the light emission spectrum of the green light emitting layer 131G is intensified by interference between the fifth reflective interface S5G and the light emission center OG. The optical path Lc5 is set in such a manner that the light with a center wavelength $\lambda c$ in the light emission spectrum of the blue light emitting layer 131B is intensified by interference between the fifth reflective interface S5B and the light emission center OB.

Specifically, the optical paths La5, Lb5 and Lc5 satisfy the following expressions (25) to (30).

$$2La5/\lambda a5 + \varphi a5/(2\pi) = Ha \quad (25)$$

$$\lambda a - 80 < \lambda a5 < \lambda a + 80 \quad (26)$$

$$2Lb5/\lambda b5 + \varphi b5/(2\pi) = Hb \quad (27)$$

$$\lambda b - 80 < \lambda b5 < \lambda b + 80 \quad (28)$$

$$2Lc5/\lambda c5 + \varphi c5/(2\pi) = Hc \quad (29)$$

$$\lambda c - 80 < \lambda c5 < \lambda c + 80 \quad (30)$$

where
Ha, Hb and Hc are each an integer of not less than 0; the unit of $\lambda a$, $\lambda a5$, $\lambda b$, $\lambda b5$, $\lambda c$ and $\lambda c5$ is nm;

$\varphi a5$ is the phase change when the light emitted from the red light emitting layer 131R is reflected by the fifth reflective interface S5R;

$\varphi b5$ is the phase change when the light emitted from the green light emitting layer 131G is reflected by the fifth reflective interface S5G;

$\varphi c5$ is the phase change when the light emitted from the blue light emitting layer 131B is reflected by the fifth reflective interface S5B;

$\varphi a5$ is a wavelength satisfying the expression (26);
$\varphi b5$ is a wavelength satisfying the expression (28); and
$\varphi c5$ is a wavelength satisfying the expression (30).

$\varphi c5$, $\varphi b5$ and $\varphi c5$ can be determined by a method similar to that for $\varphi a1$, $\varphi b1$ and $\varphi c1$. When the values of Ha, Hb and Hc are high, the so-called microcavity (minute resonator) effect cannot be obtained. Therefore, it is preferable that Ha=0, Hb=0, and Hc=0.

Here, it is presumed that Na=0, Nb=0, Nc=0, Ha=0, Hb=0, and Hc=0. In this case, a microcavity structure with a minimum resonance condition is formed by a structure which includes the first reflective interface S1R, the third reflective interface S3R, the fourth reflective interface S4R, the fifth reflective interface S5R and the sixth reflective interface S6R. Similarly, a microcavity structure with a minimum resonance condition is formed by a structure which includes the first reflective interface S1G, the third reflective interface S3G, the fourth reflective interface S4G, the fifth reflective interface S5G and the sixth reflective interface S6G. Further, a microcavity structure with a minimum resonance condition is formed by a structure which includes the first reflective interface S1B, the third reflective interface S3B, the fourth reflective interface S4B, the fifth reflective interface S5B and the sixth reflective interface S6B.

In the case where the optical path La1 satisfies the above-mentioned expressions (1) and (2) and where the optical path La5 satisfies the above-mentioned expressions (25) and (26), a peak of transmittance is generated at a predetermined wavelength due to an amplifying effect of the first reflective interface S1R and the fifth reflective interface S5R. In the case where the optical path Lb1 satisfies the above-mentioned expressions (3) and (4) and where the optical path Lb5 satisfies the above-mentioned expressions (27) and (28), a peak of transmittance is generated at a predetermined wavelength due to an amplifying effect of the first reflective interface S1G and the fifth reflective interface S5G. In the case where the optical path Lc1 satisfies the above-mentioned expressions (5) and (6) and where the optical path Lc5 satisfies the above-mentioned expressions (29) and (30), a peak of transmittance is generated at a predetermined wavelength due to an amplifying effect of the first reflective interface S1B and the fifth reflective interface S5B.

Sixth Reflective Interfaces S6R, S6G and S6B

The optical path La6 is set, for example, in such a manner that the light with a center wavelength $\lambda a$ in the light emission spectrum of the red light emitting layer 131R is weakened by interference between the sixth reflective interface S6R and the light emission center OR. In this instance, the optical path between the fifth reflective interface S5R and the sixth reflective interface S6R is not more than the center wavelength $\lambda a$ of the light emitted from the red light emitting layer 131R. The optical path Lb6 is set, for example, in such a manner that the light with a center wavelength λb in the light emission spectrum of the green light emitting layer 131G is weakened by interference between the sixth reflective interface S6G and the light emission center OG. In this instance, the optical path between the fifth reflective interface S5G and the sixth reflective interface S6G is not more than the center wavelength λb of the light emitted from the green light emitting layer 131G. The optical path Lc6 is set, for example, in such a manner that the light with a center wavelength λc in the light emission spectrum of the blue light emitting layer 131B is intensified by interference between the sixth reflective interface S6B and the light emission center OB. In this instance, the optical path between the fifth reflective interface S5B and the sixth reflective interface S6B is not more than the center wavelength λc of the light emitted from the blue light emitting layer 131B.

The optical paths La6, Lb6 and Lc6 satisfy, for example, the following expressions (31) to (36).

$$2La6/\lambda a6 + \varphi a6/(2\pi) = Fa + \frac{1}{2} \quad (31)$$

$$\lambda a - 150 < \lambda a6 < \lambda a + 150 \quad (32)$$

$$2Lb6/\lambda b6 + \varphi b6/(2\pi) = Fb + \frac{1}{2} \quad (33)$$

$$\lambda b - 150 < \lambda b6 < \lambda b + 150 \quad (34)$$

$$2Lc6/\lambda c6 + \varphi c6/(2\pi) = Fc \quad (35)$$

$$\lambda c - 150 < \lambda c6 < \lambda c + 150 \quad (36)$$

where
Fa, Fb and Fc are each an integer of not less than 0;
the unit of λa, λa6, λb, λb6, λc and λc6 is nm;
φa6 is the phase change when the light emitted from the red light emitting layer 131R is reflected by the sixth reflective interface S6R;
φb6 is the phase change when the light emitted from the green light emitting layer 131G is reflected by the sixth reflective interface S6G;
φc6 is the phase change when the light emitted from the blue light emitting layer 131B is reflected by the sixth reflective interface S6B;
λa6 is a wavelength satisfying the expression (32);
λb6 is a wavelength satisfying the expression (34); and
λc6 is a wavelength satisfying the expression (36).
φa6, φb6 and φc6 can be determined by a method similar to that for φa1, φb1 and φc1. In the case where the optical paths La6, Lb6 and Lc6 satisfy the above expressions (31) to (36), the light emitting state can be adjusted on the light emitting section (the red light emitting section 10R, the green light emitting section 10G, the blue light emitting section 10B) basis. Thus, by the addition of the reflection on the sixth reflective interface S6R, the light generated in the red light emitting layer 131R is weakened, and the half-value width of the spectrum is broadened. In addition, by the addition of the reflectance on the sixth reflective interface S6G, the light generated in the green light emitting layer 131G is weakened, and the half-value width of the spectrum is broadened. By the addition of the reflection on the sixth reflective interface S6B, the light generated in the blue light emitting layer 131B is intensified, and the half-value width of the spectrum is narrowed.

Such a light emitting device 1 can be manufactured by forming the electrode layers 12R, 12G and 12B, the organic layers (the red organic layer 13R, the green organic layer 13G, and the blue organic layer 13B), the metal layers 181R, 181G and 181B, the transparent layers 182R, 182G and 182B, the metal layers 183R, 183G and 183B, the transparent layers 15R, 15G and 15B, the transparent layers 16R, 16G and 16B and the transparent layers 17R, 17G and 17B in this order over the substrate 11. The red organic layers 13R, the green organic layers 13G and the blue organic layers 13B may be formed by a vapor deposition method or may be formed by printing. In other words, the red organic layers 13R, the green organic layers 13G and the blue organic layers 13B may be printed layers. The metal layers 181R, 181G and 181B may be composed of a common layer. In this case, the materials and thicknesses of the metal layers 181R, 181G and 181B are equal to one another. The transparent layers 182R, 182G and 182B may be composed of a common layer. In this case, the materials and thicknesses of the transparent layers 182R, 182G and 182B are equal to one another. The metal layers 183R, 183G and 183B may be composed of a common layer. In this case, the materials and thicknesses of the metal layers 183R, 183G and 183B are equal to one another.

Operation and Effect

In the light emitting device 1 according to this modification, a driving current is injected into each of the light emitting layers (the red light emitting layer 131R, the green light emitting layer 131G, and the blue light emitting layer 131B) of the red light emitting section 10R, the green light emitting section 10G and the blue light emitting section 10B through the electrode layers 12R, 12G and 12B and the laminates 18R, 18G and 18B. As a result, in each light emitting layer, recombination of holes and electrons occurs, to produce exitons, thereby emitting light.

For example, the light produced in the red organic layer 13R is subjected to multiple reflection between the first reflective interface S1R and the third reflective interface S3R, and is extracted from the light extraction surface SDR. Red light LR is extracted from the light extraction surface SDR in the red light emitting section 10R. Green light LG is extracted from the light extraction surface SDG in the green light emitting section 10G, and blue light LB is extracted from the light extraction surface SDB in the blue light emitting section 10B. By additive mixture of the red light LR, the green light LG and the blue light LB, various colors are expressed.

In this modification, in each of the light emitting sections (the red light emitting section 10R, the green light emitting section 10G, and the blue light emitting section 10B), the two reflective interfaces (the third reflective interface S3R, S3G, S3B and the fourth reflective interface S4R, S4G, S4B) are provided on the outer side of the cathode electrode (the laminate 18R, 18G, 18B), and a microcavity structure with a minimum resonance condition is formed by a structure which includes the first reflective interface S1R, S1G, S1B and the fifth reflective interface S5R, S5G, S5B and the sixth reflective interface S6R, S6G, S6B and the third reflective interface S3R, S3G, S3B and the fourth reflective interface S4R, S4G, S4B. This ensures that worsening of viewing angle characteristics of chromaticity can be restrained, even in the case where the metal layers 181R, 181G and 181B and the metal layers 183R, 183G and 183B included in the cathode electrodes on the side of the light extraction surfaces SDR, SDG and SDB are increased in film thickness.

Further, in this modification, in each of the light emitting sections (the red light emitting section 10R, the green light emitting section 10G, and the blue light emitting section 10B), the microcavity structure is configured in such a manner that the first reflective interface S1R, S1G and the fifth reflective interface S5R, S5G intensify light in the wavelength band of the light emitted from each light emitting layer (the red light emitting layer 131R, the green light emitting layer 131G) and that the third reflective interface S3R, S3G, S3B and the fourth reflective interface S4R, S4G, S4B weaken light in the wavelength band of the light emitted from each light emitting layer (the red light emitting layer 131R, the green light emitting layer 131G) and intensify light in the wavelength band of the light emitted from the blue light emitting layer 131B.

This ensures that red light LR which is gentle in the vicinity of a peak is extracted from the light extraction surface SDR in the red light emitting section 10R, green light LG which is gentle in the vicinity of a peak is extracted from the light extraction surface SDG in the green light emitting section 10G, and blue light LB which has a steep peak is extracted from the light extraction surface SDB in the blue light emitting section 10B. As a result, angle dependencies of luminance and chromaticity are reduced in the case where the difference between the effect of the resonator structures of the red light emitting section 10R and the green light emitting section 10G and the effect of the resonator structure of the blue light emitting section 10B is reduced. Therefore, both good feed performance and good viewing angle characteristic of chromaticity can be realized. In addition, the light emitting device 1 having high viewing angle characteristics is preferable also for a display device requiring high image quality, and can enhance the productivity of the display device.

Besides, in this modification, the optical path between the fifth reflective interface S5R and the sixth reflective interface S6R is not more than the center wavelength $\lambda a$ of the light emitted from the red light emitting layer 131R. Similarly, the optical path between the fifth reflective interface S5G and the sixth reflective interface S6G is not more than the center wavelength $\lambda b$ of the light emitted from the green light emitting layer 131G. The optical path between the fifth reflective interface S5B and the sixth reflective interface S6B is not more than the center wavelength $\lambda c$ of the light emitted from the blue light emitting layer 131B. As a result, the peak profiles of the spectra of the lights generated in the red light emitting layer 131R, the green light emitting layer 131G and the blue light emitting layer 131B can be adjusted, by the actions of the fifth reflective interfaces S5R, S5G and S5B and the sixth reflective interfaces S6R, S6G and S6B on the lights generated in the light emitting layers (131R, 131G and 131B). Therefore, worsening of viewing angle characteristics of chromaticity can be restrained, even in the case where the cathode electrodes (the electrodes 14R, 14G and 14B) on the side of the light extraction surfaces SDR, SDG and SDB are increased in thickness.

In addition, in this modification, the microcavity structure in the red light emitting section 10R is configured such as to satisfy the above-mentioned expressions (1), (2), (25), (26), (31), (32), (19) and (20). Similarly, the microcavity structure in the green light emitting section 10G is configured such as to satisfy the above-mentioned expressions (3), (4), (27), (28), (33), (34), (21) and (22). This ensures that red light LR which is gentle in the vicinity of a peak is extracted from the light extraction surface SDR in the red light emitting section 10R, and green light LG which is gentle in the vicinity of a peak is extracted from the light extraction surface SDG in the green light emitting section 10G. As a result, sudden variations in luminance and chromaticity with angle can be restrained.

Further, in this modification, the microcavity structure in the blue light emitting section 10B is configured such as to satisfy the above-mentioned expressions (5), (6), (29), (30), (35), (36), (23) and (24). This ensures that blue light LB which has a steep peak is extracted from the light extraction surface SDB in the blue light emitting section 10B. Therefore, the difference between the effect of the resonator structures of the red light emitting section 10R and the green light emitting section 10G and the effect of the resonator structure of the blue light emitting section 10B is reduced, and angle dependencies of luminance and chromaticity are reduced. Accordingly, light distribution characteristics can be enhanced. In addition, the light emitting device 1 having high light distribution characteristics is also preferable for a display device requiring high image quality, and can enhance the productivity of the display device.

In this modification, the total thicknesses of the metal layers 181R, 181G and 181B and the metal layers 183R, 183G and 183B are, for example, not less than 15 nm. This makes it possible to enhance feed performance without worsening the angle dependency of chromaticity. Besides, in this modification, like in the above-described embodiment, the total thicknesses of the metal layers 181R, 181G and 181B and the metal layers 183R, 183G and 183B are set in the range of 15 to 38 nm, whereby the angle dependencies of luminance and chromaticity are not worsened.

In addition, in this modification, the substrate 11 is a circuit substrate provided with circuits (pixel circuits 18-1) for driving the red light emitting layers 131R, the green light emitting layers 131G and the blue light emitting layers 131B. Here, the light emitting device 1 is a top emission type light emitting device. This ensures that the lights emitted from the red light emitting layers 131R, the green light emitting layers 131G and the blue light emitting layers 131B are not shielded by the pixel circuits 18-1 in the circuit substrate, and, therefore, a high light extraction efficiency can be obtained.

Besides, in this modification, it is preferable that the red light emitting layers 131R, the green light emitting layers 131G and the blue light emitting layers 131B are printed layers. Since organic layers undergo a drying step or the like, differences in their thickness on a region basis are liable to be generated in the organic layers. In other words, a film thickness distribution is liable to be generated in the organic layers. On the other hand, in the present embodiment, since the red light emitting layers 131R, the green light emitting layers 131G and the blue light emitting layers 131B are printed layers, differences in the effect of the resonator structure on a light emitting element basis due to the film thickness distribution in the red light emitting layers 131R, the green light emitting layers 131G and the blue light emitting layers 131B can be adjusted.

3. Application Examples

Application examples of the light emitting device 1 described in the above embodiment and the like will be described below.

Application Example A

Figure 12:
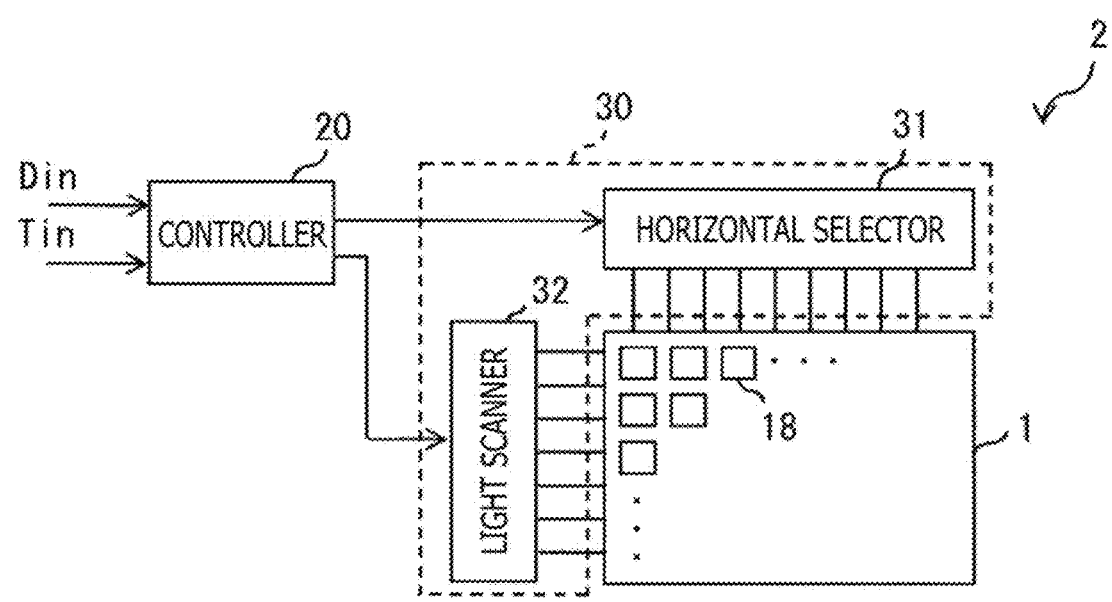
FIG. 12 is a figure depicting a general configuration of a display device obtained by application of the light emitting device illustrated in FIG. 1, etc.
Figure 13:
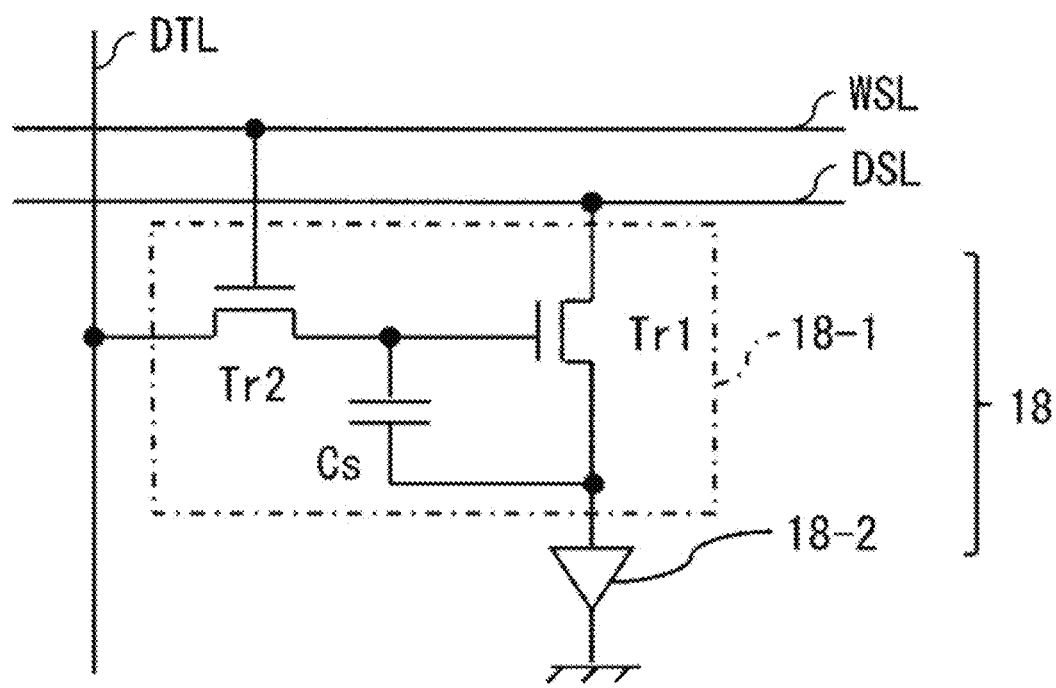
FIG. 13 is a circuit diagram depicting a circuit configuration of a pixel illustrated in FIG. 12.

FIG. 12 depicts a general configuration example of a display device 2 which is an application example of the light emitting device 1 according to the above-described embodiment and modifications thereof. FIG. 13 depicts an example of a circuit configuration of each pixel 18 provided in the display device 2. The display device 2 includes, for example, the light emitting device 1, a controller 20 and a driver 30. The driver 30 is mounted, for example, at an outer edge portion of the light emitting device 1. The light emitting device 1 includes a plurality of pixels 18 arranged in a matrix pattern. The controller 20 and the driver 30 drive the light emitting device 1 (the plurality of pixels 18), based on a video signal Din and a synchronizing signal Tin which are externally inputted.

Light Emitting Device 1

The light emitting device 1 displays an image based on the video signal Din and the synchronizing signal Tin, which are externally inputted, through active matrix driving of the pixels 18 by the controller 20 and the driver 30. The light emitting device 1 includes a plurality of scanning lines WSL extending in a row direction, a plurality of signal lines DTL extending in a column direction, a plurality of power supply lines DSL, and the plurality of pixels 18 arranged in the matrix pattern.

The scanning lines WSL are used for selection of each pixel 18, and supply each pixel 18 with a selection pulse for selecting the pixels 18 on the basis of a predetermined unit (for example, pixel row). The signal lines DTL are used for supplying each pixel 18 with a signal voltage Vsig according to the video signal Din, and supply each pixel 18 with data pulses including the signal voltage Vsig. The power supply lines DSL are for supplying each pixel 18 with electric power.

The plurality of pixels 18 provided in the light emitting device 1 include pixels 18 for emitting red light, pixels 18 for emitting green light, and pixels 18 for emitting blue light. Hereinafter, the pixels 18 for emitting red light will be referred to as pixels 18R, the pixels 18 for emitting green light will be referred to as pixels 11G, and the pixels 18 for emitting blue light will be referred to as pixels 18B. In the plurality of pixels 18, the pixels 11R, 11G and 11B constitute a display pixel, which is a display unit of color images. Note that each display pixel may further include, for example, pixels 18 for emitting light in other color (e.g., white, yellow, or the like). Therefore, the plurality of pixels 18 provided in the light emitting device 1 are divided into groups as display pixels, each having a predetermined number of pixels 18. In each display pixel, the plurality of pixels 18 are aligned in a line in a predetermined direction (e.g., row direction).

Each signal line DTL is connected to an output end of a horizontal selector 31, which will be described later. For example, one each of the plurality of signal lines DTL is allocated to each pixel column. Each scanning line WSL is connected to an output end of a light scanner 32, which will be described later. For example, one each of the plurality of scanning lines WSL is allocated to each pixel row. Each power supply line DSL is connected to an output end of a power source. For example, one each of the plurality of power supply lines DSL is allocated to each pixel row.

Each pixel 18 includes the pixel circuit 18-1 and an organic electroluminescent section 18-2. The organic electroluminescent section 18-2 corresponds to the light emitting section (e.g., the red light emitting section 10R, the green light emitting section 10G, or the blue light emitting section 10B) according to the above-described embodiment and modifications thereof.

The pixel circuit 18-1 controls light emission and quenching of the organic electroluminescent section 18-2. The pixel circuit 18-1 has a function of holding a voltage written into each pixel 18 by write scanning. The pixel circuit 18-1 includes, for example, a driving transistor Tr1, a writing transistor Tr2 and a storage capacitor Cs.

The writing transistor Tr2 controls the application of the signal voltage Vsig corresponding to the video signal Din to a gate of the driving transistor Tr1. Specifically, the writing transistor Tr2 samples the voltage of the signal line DTL, and writes the voltage obtained by the sampling into the gate of the driving transistor Tr1. The driving transistor Tr1 is connected in series with the organic electroluminescent section 18-2. The driving transistor Tr1 drives the organic electroluminescent section 18-2. The driving transistor Tr1 controls a current flowing through the organic electroluminescent section 18-2 in accordance with the magnitude of the voltage sampled by the writing transistor Tr2. The storage capacitor Cs is for holding a predetermined voltage between the gate and a source of the driving transistor Tr1. The storage capacitor Cs has a role of keeping constant the gate-source voltage of the driving transistor Tr1 during a predetermined period. Note that the pixel circuit 18-1 may have a circuit configuration obtained by adding various capacitors and transistors to the aforementioned 2Tr-1C circuit, or may have a circuit configuration different from the aforementioned 2Tr-1C circuit configuration.

Each signal line DTL is connected to an output end of the horizontal selector 31, which will be described later, and to a source or a drain of the writing transistor Tr2. Each scanning line WSL is connected to an output end of the light scanner 32, which will be described later, and to a gate of the writing transistor Tr2. Each power supply line DSL is connected to a power supply circuit and to the source or a drain of the driving transistor Tr1.

The gate of the writing transistor Tr2 is connected to the scanning line WSL. The source or the drain of the writing transistor Tr2 is connected to the signal line DTL. That one terminal of the source and the drain of the writing transistor Tr2 which is not connected to the signal line DTL is connected to the gate of the driving transistor Tr1. The source or the drain of the driving transistor Tr1 is connected to the power supply line DSL. That one terminal of the source and the drain of the driving transistor Tr1 which is not connected to the power supply line DSL is connected to an anode 21 of the organic electroluminescent section 18-2. One end of the storage capacitor Cs is connected to the gate of the driving transistor Tr1. The other end of the storage capacitor Cs is connected to that one terminal of the source and the drain of the driving transistor Tr1 which is on the organic electroluminescent section 18-2 side.

Driver 30

The driver 30 includes, for example, the horizontal selector 31 and the light scanner 32. The horizontal selector 31 applies the analog signal voltage Vsig, inputted from the controller 20, to each signal line DTL in accordance with (synchronously with) an input of a control signal, for example. The light scanner 32 scans the plurality of pixels 18 on the basis of a predetermined unit.

Controller 20

The controller 20 will be described below. The controller 20 applies, for example, predetermined correction to the digital video signal Din inputted externally, and, based on a video signal obtained thereby, produces the signal voltage Vsig. The controller 20 outputs the produced signal voltage Vsig to the horizontal selector 31, for example. The controller 20 outputs a control signal to each circuit in the driver 30 in accordance with (synchronously with) the synchronizing signal Tin inputted externally, for example.

In this application example, the light emitting device 1 is used as a display panel for displaying images. By this, even in the case where the light emitting device 1 is large, it is possible to provide a display device 2 having excellent display quality as well as small angle dependencies of luminance and chromaticity.

Application Example B

Figure 14:
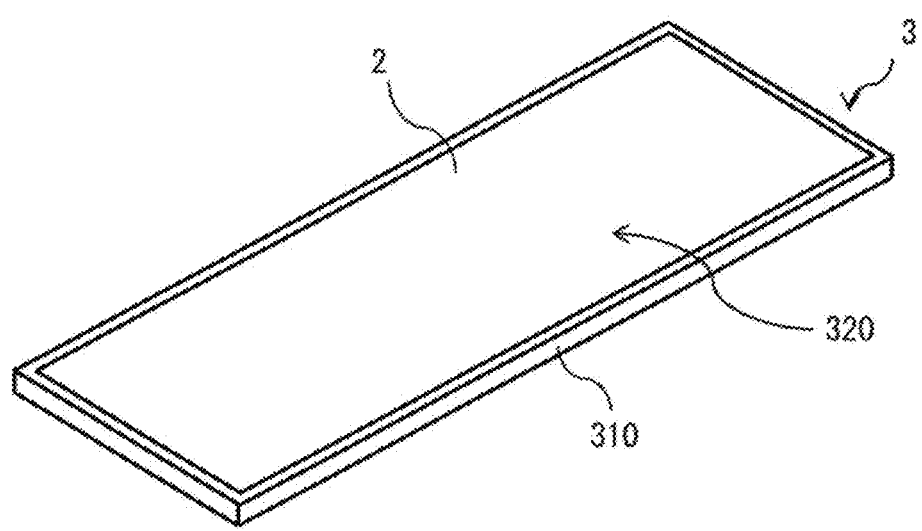
FIG. 14 is a figure depicting an example of appearance of an electronic apparatus obtained by application of the display device illustrated in FIG. 12.

The display device 2 according to Application Example A described above can be used for various types of electronic apparatuses. FIG. 14 depicts a perspective configuration of an electronic apparatus 3 obtained by application of the display device 2 according to Application Example A described above. The electronic apparatus 3 is, for example, a sheet-shaped personal computer including a display surface 320 at a main surface of a housing 310. The electronic apparatus 3 has the display device 2 according to the above-described Application Example A at the display surface 320. The display device 2 according to the above-described Application Example A is disposed such that a video display surface is directed to the outside. In this application example, the display device 2 according to Application Example A described above is provided at the display surface 320; therefore, even in the case where the display surface 320 is large in size, it is possible to provide an electronic apparatus 3 having excellent display quality as well as small angle dependencies of luminance and chromaticity.

Application Example C

An application example of the light emitting device 1 according to the above-described embodiment and modifications thereof will be described below. The light emitting device 1 according to the above-described embodiment and modifications thereof is applicable to light sources of illumination apparatuses in all fields, such as table or floor type illumination apparatuses or room illumination apparatus.

Figure 15:
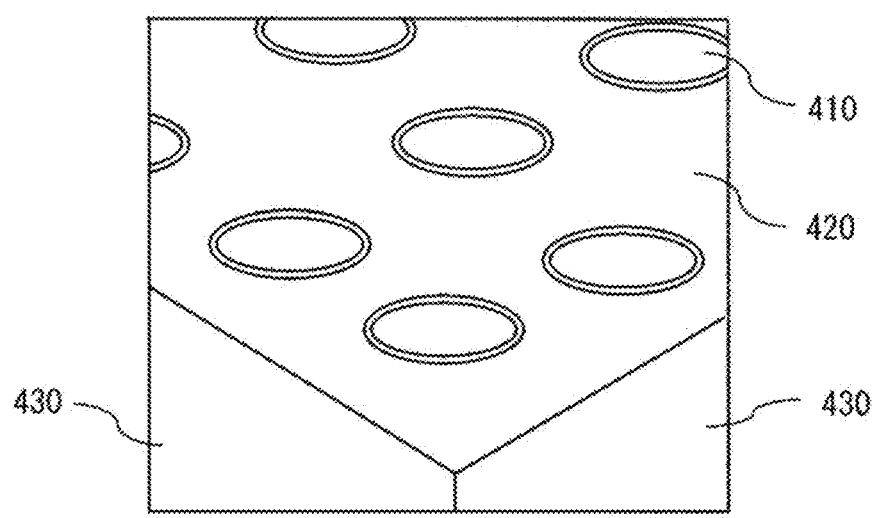
FIG. 15 is a figure depicting an example of appearance of an illumination apparatus obtained by application of the light emitting device illustrated in FIG. 1, etc.

FIG. 15 depicts appearance of a room illumination apparatus obtained by application of the light emitting device 1 according to the above-described embodiment and modifications thereof. The illumination apparatus has, for example, illuminating sections 410 each including the light emitting device 1 according to the above-described embodiment and modifications thereof. An appropriate number of the illuminating sections 410 are arranged at appropriate intervals at a ceiling 420 of a building. Note that the illuminating sections 410 can be disposed not only at the ceiling 420 but also at an arbitrary place such as a wall 430 or a floor (not illustrated), according to the use thereof.

In these illumination apparatuses, illumination is conducted by light from the light emitting devices 1 according to the above-described embodiment and modifications thereof. As a result, it is possible to realize an illumination apparatus having excellent illumination quality as well as small angle dependencies of luminance and chromaticity.

While the present disclosure has been described above by showing the embodiment, the present disclosure is not to be limited to the embodiment, and various modifications are possible. Note that the effects described herein are mere examples. The effects of the present disclosure are not to be limited to those described herein. The present disclosure may have other effects than those described herein. In addition, the present disclosure may have the following configurations.

(1)

A light emitting device including:

a plurality of organic electroluminescent sections each including a first electrode layer, an organic light emitting layer, a second electrode layer having a film thickness of not less than 15 nm and a reflective layer in this order; and a light extraction surface from which light emitted from each of the organic electroluminescent sections through the reflective layer is extracted, in which the reflective layer includes two reflective interfaces, in each of the organic electroluminescent sections, a microcavity structure is formed by a structure including a first reflective interface on the organic light emitting layer side of the first electrode layer, a second reflective interface on the organic light emitting layer side of the second electrode layer, and the two reflective interfaces included in the reflective layer, the plurality of organic electroluminescent sections include a plurality of first organic electroluminescent sections that emit light in a first wavelength band, and a plurality of second organic electroluminescent sections that emit light in a second wavelength band on a shorter wavelength side than the first wavelength band, and in each of the first organic electroluminescent sections and each of the second organic electroluminescent sections, the microcavity structure is configured in such a manner that the first reflective interface and the second reflective interface intensify the light in the first wavelength band and the light in the second wavelength band, and that the two reflective interfaces included in the reflective layer weaken the light in the first wavelength band and intensify the light in the second wavelength band.

(2)

The light emitting device as described in the above paragraph (1), in which optical paths between the second reflective interface and the two reflective interfaces included in the reflective layer are not more than a center wavelength of the light emitted from the corresponding organic light emitting layer.

(3)

The light emitting device as described in the above paragraph (1) or (2), in which the microcavity structure is a microcavity structure with a minimum resonance condition.

(4)

The light emitting device as described in the above paragraph (3), in which in each of the first organic electroluminescent sections and each of the second organic electroluminescent sections, the microcavity structure is configured such as to satisfy the following expressions (A) to (H):

$$2La1/\lambda a1 + \varphi a1/(2\pi) = 0 \tag{A}$$

$$\lambda a - 150 < \lambda a1 < \lambda a + 80 \tag{B}$$

$$2La2/\lambda a2 + \varphi a2/(2\pi) = 0 \tag{C}$$

$$\lambda a - 80 < \lambda a2 < \lambda a + 80 \tag{D}$$

$$2La3/\lambda a3 + \varphi a3/(2\pi) = Ka + \tfrac{1}{2} \tag{E}$$

$$\lambda a - 150 < \lambda a3 < \lambda a + 150 \tag{F}$$

$$2La4/\lambda a4 + \varphi a4/(2\pi) = Ja + \tfrac{1}{2} \tag{G}$$

$$\lambda a - 150 < \lambda a4 < \lambda a + 150 \tag{H}$$

where

La1 is an optical path between the first reflective interface and a light emission center of the organic light emitting layer of the first organic electroluminescent section;

La2 is an optical path between the second reflective interface and the light emission center of the organic light emitting layer of the first organic electroluminescent section;

La3 is an optical path between one reflective interface of the two reflective interfaces included in the reflective layer and the light emission center of the organic light emitting layer of the first organic electroluminescent section;

La4 is an optical path between the other reflective interface of the two reflective interfaces included in the reflective layer and the light emission center of the organic light emitting layer of the first organic electroluminescent section;

$\varphi a1$ is a phase change when the light emitted from the organic light emitting layer is reflected by the first reflective interface, in the first organic electroluminescent section;

$\varphi a2$ is a phase change when the light emitted from the organic light emitting layer is reflected by the second reflective interface, in the first organic electroluminescent section;

$\varphi a3$ is a phase change when the light emitted from the organic light emitting layer is reflected by the one reflective interface of the two reflective interfaces included in the reflective layer, in the first organic electroluminescent section;

$\varphi b4$ is a phase change when the light emitted from the organic light emitting layer is reflected by the other reflective interface of the two reflective interfaces included in the reflective layer, in the first organic electroluminescent section;

$\lambda a$ is a center wavelength in a light emission spectrum of the organic light emitting layer of the first organic electroluminescent section;

$\lambda a1$ is a wavelength satisfying the expression (B);

$\lambda a2$ is a wavelength satisfying the expression (D);

$\lambda a3$ is a wavelength satisfying the expression (F);

$\lambda a4$ is a wavelength satisfying the expression (H); and

Ka and Ja are each an integer of not less than 0.

(5)

The light emitting device as described in the above paragraph (4), in which in each of the first organic electroluminescent sections and each of the second organic electroluminescent sections, the microcavity structure is configured such as to satisfy the following expressions (I) to (P):

$$2Lc1/\lambda c1 + \varphi c1/(2\pi) = 0 \quad (I)$$

$$\lambda c - 150 < \lambda c1 < \lambda c + 80 \quad (J)$$

$$2Lc2/\lambda c2 + \varphi c2/(2\pi) = 0 \quad (K)$$

$$\lambda c - 80 < \lambda c2 < \lambda c + 80 \quad (L)$$

$$2Lc3/\lambda c3 + \varphi c3/(2\pi) = Kc \quad (M)$$

$$\lambda c - 150 < \lambda c3 < \lambda c + 150 \quad (N)$$

$$2Lc4/\lambda c4 + \varphi c4/(2\pi) = Jc \quad (O)$$

$$\lambda c - 150 < \lambda c4 < \lambda c + 150 \quad (P)$$

where

Lc1 is an optical path between the first reflective interface and a light emission center of the organic light emitting layer of the second organic electroluminescent section;

Lc2 is an optical path between the second reflective interface and the light emission center of the organic light emitting layer of the second organic electroluminescent section;

Lc3 is an optical path between the one reflective interface of the two reflective interfaces included in the reflective layer and the light emission center of the organic light emitting layer of the second organic electroluminescent section;

Lc4 is an optical path between the other reflective interface of the two reflective interfaces included in the reflective layer and the light emission center of the organic light emitting layer of the second organic electroluminescent section;

$\varphi c1$ is a phase change when the light emitted from the organic light emitting layer is reflected by the first reflective interface, in the second organic electroluminescent section;

$\varphi c2$ is a phase change when the light emitted from the organic light emitting layer is reflected by the second reflective interface, in the second organic electroluminescent section;

$\varphi c3$ is a phase change when the light emitted from the organic light emitting layer is reflected by the one reflective interface of the two reflective interfaces included in the reflective layer, in the second organic electroluminescent section;

$\varphi c4$ is a phase change when the light emitted from the organic light emitting layer is reflected by the other reflective interface of the two reflective interfaces included in the reflective layer, in the second organic electroluminescent section;

$\lambda c$ is a center wavelength in the light emission spectrum of the organic light emitting layer of the second organic electroluminescent section;

$\lambda c1$ is a wavelength satisfying the expression (J);

$\lambda c2$ is a wavelength satisfying the expression (L);

$\lambda c3$ is a wavelength satisfying the expression (N);

$\lambda c4$ is a wavelength satisfying the expression (P); and

Kc and Jc are each an integer of not less than 0.

(6)

The light emitting device as described in any one of the above paragraphs (1) to (5), in which the second electrode layer is configured by using a single metal layer having a film thickness of not less than 15 nm.

(7)

The light emitting device as described in any one of the above paragraphs (1) to (5), in which the second electrode layer includes a first metal layer, a transparent conductive layer and a second metal layer in this order from the organic light emitting layer side, and the total thickness of the first metal layer and the second metal layer is not less than 15 nm.

(8)

The light emitting device as described in the above paragraph (7), in which the first metal layer is thicker than the second metal layer.

(9)

The light emitting device as described in any one of the above paragraphs (1) to (8), further including:

a circuit substrate formed with a driving circuit for driving each of the organic electroluminescent sections, on a side opposite to the light extraction surface, in positional relation with each of the organic electroluminescent sections.

(10)

The light emitting device as described in any one of the above paragraphs (1) to (9),
in which the organic light emitting layer is a printed layer.

The present disclosure contains subject matter related to that disclosed in Japanese Priority Patent Application JP 2018-102520 filed in the Japan Patent Office on May 29, 2018, and Japanese Priority Patent Application No. 2019-076571 filed in the Japan Patent Office on Apr. 12, 2019 the entire content of which is hereby incorporated by reference.

What is claimed is:

1. A light emitting device, comprising:
a plurality of organic electroluminescent sections each including a first electrode layer, an organic light emitting layer, a second electrode layer having a film thickness of not less than 15 nm and a reflective layer in this order; and
a light extraction surface from which light emitted from each of the plurality of organic electroluminescent sections through the reflective layer is extracted, wherein
the reflective layer includes two reflective interfaces,
in each of the plurality of organic electroluminescent sections, a microcavity structure is formed by a structure including a first reflective interface on the organic light emitting layer side of the first electrode layer, a second reflective interface on the organic light emitting layer side of the second electrode layer, and the two reflective interfaces included in the reflective layer,
the plurality of organic electroluminescent sections include a plurality of first organic electroluminescent sections configured to emit light in a first wavelength band, and a plurality of second organic electroluminescent sections configured to emit light in a second wavelength band on a shorter wavelength side than the first wavelength band, and
in each of the plurality of first organic electroluminescent sections and each of the plurality of second organic electroluminescent sections, the microcavity structure is configured in such a manner that the first reflective interface and the second reflective interface intensify the light in the first wavelength band and the light in the second wavelength band, and that the two reflective interfaces included in the reflective layer weaken the light in the first wavelength band and intensify the light in the second wavelength band.

2. The light emitting device according to claim 1, wherein optical paths between the second reflective interface and the two reflective interfaces included in the reflective layer are not more than a center wavelength of light emitted from a corresponding organic light emitting layer.

3. The light emitting device according to claim 1, wherein the microcavity structure is a microcavity structure with a minimum resonance condition.

4. The light emitting device according to claim 3, wherein in each of the plurality of first organic electroluminescent sections and each of the plurality of second organic electroluminescent sections, the microcavity structure is configured such as to satisfy the following expressions (A) to (H):

$$2La1/\lambda a1 + \varphi a1/(2\pi) = 0 \tag{A}$$

$$\lambda a - 150 < \lambda a1 < \lambda a + 80 \tag{B}$$

$$2La2/\lambda a2 + \varphi a2/(2\pi) = 0 \tag{C}$$

$$\lambda a - 80 < \lambda a2 < \lambda a + 80 \tag{D}$$

$$2La3/\lambda a3 + \varphi a3/(2\pi) = Ka + \tfrac{1}{2} \tag{E}$$

$$\lambda a - 150 < \lambda a3 < \lambda a + 150 \tag{F}$$

$$2La4/\lambda a4 + \varphi a4/(2\pi) = Ja + \tfrac{1}{2} \tag{G}$$

$$\lambda a - 150 < \lambda a4 < \lambda a + 150 \tag{H}$$

where
$La1$ is an optical path between the first reflective interface and a light emission center of the organic light emitting layer of a first organic electroluminescent section of the plurality of first organic electroluminescent sections;
$La2$ is an optical path between the second reflective interface and the light emission center of the organic light emitting layer of the first organic electroluminescent section;
$La3$ is an optical path between one reflective interface of the two reflective interfaces included in the reflective layer and the light emission center of the organic light emitting layer of the first organic electroluminescent section;
$La4$ is an optical path between the other reflective interface of the two reflective interfaces included in the reflective layer and the light emission center of the organic light emitting layer of the first organic electroluminescent section;
$\varphi a1$ is a phase change when the light emitted from the organic light emitting layer is reflected by the first reflective interface, in the first organic electroluminescent section;
$\varphi a2$ is a phase change when the light emitted from the organic light emitting layer is reflected by the second reflective interface, in the first organic electroluminescent section;
$\varphi a3$ is a phase change when the light emitted from the organic light emitting layer is reflected by the one reflective interface of the two reflective interfaces included in the reflective layer, in the first organic electroluminescent section;
$\varphi a4$ is a phase change when the light emitted from the organic light emitting layer is reflected by the other reflective interface of the two reflective interfaces included in the reflective layer, in the first organic electroluminescent section;
$\lambda a$ is a center wavelength in a light emission spectrum of the organic light emitting layer of the first organic electroluminescent section;
$\lambda a1$ is a wavelength satisfying the expression (B);
$\lambda a2$ is a wavelength satisfying the expression (D);
$\lambda a3$ is a wavelength satisfying the expression (F);
$\lambda a4$ is a wavelength satisfying the expression (H); and
$Ka$ and $Ja$ are each an integer of not less than 0.

5. The light emitting device according to claim 4, wherein in each of the plurality of first organic electroluminescent sections and each of the plurality of second organic electroluminescent sections, the microcavity structure is configured such as to satisfy the following expressions (I) to (P):

$$2Lc1/\lambda c1 + \varphi c1/(2\pi) = 0 \tag{I}$$

$$\lambda c - 150 < \lambda c1 < \lambda c + 80 \tag{J}$$

$$2Lc2/\lambda c2 + \varphi c2/(2\pi) = 0 \tag{K}$$

$$\lambda c - 80 < \lambda c2 < \lambda c + 80 \tag{L}$$

$$2Lc3/\lambda c3 + \varphi c3/(2\pi) = Kc \tag{M}$$

$$\lambda c-150<\lambda c3<\lambda c+150 \quad \text{(N)}$$

$$2Lc4/\lambda c4+\varphi c4/(2\pi)=Jc \quad \text{(O)}$$

$$\lambda c-150<\lambda c4<\lambda c+150 \quad \text{(P)}$$

where
- Lc1 is an optical path between the first reflective interface and a light emission center of the organic light emitting layer of a second organic electroluminescent section of the plurality of second organic electroluminescent sections;
- Lc2 is an optical path between the second reflective interface and the light emission center of the organic light emitting layer of the second organic electroluminescent section;
- Lc3 is an optical path between the one reflective interface of the two reflective interfaces included in the reflective layer and the light emission center of the organic light emitting layer of the second organic electroluminescent section;
- Lc4 is an optical path between the other reflective interface of the two reflective interfaces included in the reflective layer and the light emission center of the organic light emitting layer of the second organic electroluminescent section;
- φc1 is a phase change when the light emitted from the organic light emitting layer is reflected by the first reflective interface, in the second organic electroluminescent section;
- φc2 is a phase change when the light emitted from the organic light emitting layer is reflected by the second reflective interface, in the second organic electroluminescent section;
- φc3 is a phase change when the light emitted from the organic light emitting layer is reflected by the one reflective interface of the two reflective interfaces included in the reflective layer, in the second organic electroluminescent section;
- φc4 is a phase change when the light emitted from the organic light emitting layer is reflected by the other reflective interface of the two reflective interfaces included in the reflective layer, in the second organic electroluminescent section;
- λc is a center wavelength in the light emission spectrum of the organic light emitting layer of the second organic electroluminescent section;
- λc1 is a wavelength satisfying the expression (J);
- λc2 is a wavelength satisfying the expression (L);
- λc3 is a wavelength satisfying the expression (N);
- λc4 is a wavelength satisfying the expression (P); and
- Kc and Jc are each an integer of not less than 0.

6. The light emitting device according to claim 1, wherein the second electrode layer is configured by using a single metal layer having a film thickness of not less than 15 nm.

7. The light emitting device according to claim 1, wherein the second electrode layer includes a first metal layer, a transparent conductive layer and a second metal layer in this order from the organic light emitting layer side, and
a total thickness of the first metal layer and the second metal layer is not less than 15 nm.

8. The light emitting device according to claim 7, wherein the first metal layer is thicker than the second metal layer.

9. The light emitting device according to claim 1, further comprising:
a circuit substrate comprising a driving circuit configured to drive each of the plurality of organic electroluminescent sections, on a side opposite to the light extraction surface, in positional relation with each of the plurality of organic electroluminescent sections.

10. The light emitting device according to claim 1, wherein the organic light emitting layer is a printed layer.

* * * * *